(12) United States Patent
Kugler et al.

(10) Patent No.: US 11,314,177 B2
(45) Date of Patent: Apr. 26, 2022

(54) SUPPORTING AN OPTICAL ELEMENT

(71) Applicant: Carl Zeiss SMT GmbH, Oberkochen (DE)

(72) Inventors: Jens Kugler, Aalen (DE); Bernhard Geuppert, Aalen (DE); Alexander Kharitonov, Schwaebisch Gmuend (DE)

(73) Assignee: Carl Zeiss SMT GmbH

( * ) Notice: Subject to any disclaimer, the term of this patent is extended or adjusted under 35 U.S.C. 154(b) by 0 days.

(21) Appl. No.: 17/181,548

(22) Filed: Feb. 22, 2021

(65) Prior Publication Data

US 2021/0181644 A1 Jun. 17, 2021

Related U.S. Application Data

(63) Continuation of application No. PCT/EP2019/075695, filed on Sep. 24, 2019.

(30) Foreign Application Priority Data

Sep. 25, 2018 (DE) .................. 102018216344.8

(51) Int. Cl.
*G03F 7/20* (2006.01)
*G01B 11/00* (2006.01)
*G02B 7/02* (2021.01)

(52) U.S. Cl.
CPC ........ *G03F 7/70825* (2013.01); *G01B 11/005* (2013.01); *G02B 7/023* (2013.01);
(Continued)

(58) Field of Classification Search
CPC ............. G03F 7/70825; G03F 7/70258; G03F 7/70366; G03F 7/70775; G03F 7/7085;
(Continued)

(56) References Cited

U.S. PATENT DOCUMENTS 5,750,897 A * 5/1998 Kato ...................... G05D 19/02
73/663
2007/0183064 A1 8/2007 Shibazaki
(Continued)

FOREIGN PATENT DOCUMENTS

DE 102019215369 A1 * 11/2019 ........... G03F 7/7085

OTHER PUBLICATIONS

International Search Report and Written Opinion for corresponding PCT Appl No. PCT/EP2019/075695, dated Jan. 7, 2020.

*Primary Examiner* — Christina A Riddle
(74) *Attorney, Agent, or Firm* — Fish & Richardson P.C.

(57) ABSTRACT

An optical arrangement for use in an optical imaging device includes an optical element unit and a detection device and/or an actuating device. The optical element unit includes at least one optical element. The detection device determines in a plurality of M degrees of freedom in each case a detection value which is representative of a relative position or orientation of an element reference of the optical element in relation to a primary reference of the detection device in the respective degree of freedom. The detection device includes a plurality of N detection units, each of which outputs a detection signal which is representative of a distance and/or a displacement of the detection unit in relation to a secondary reference assigned to the optical element and the respective detection unit.

21 Claims, 2 Drawing Sheets

(52) U.S. Cl.
CPC ........ *G03F 7/7085* (2013.01); *G03F 7/70258* (2013.01); *G03F 7/70366* (2013.01); *G03F 7/70775* (2013.01)

(58) Field of Classification Search
CPC . G03F 7/70141; G03F 7/70225–70241; G03F 7/70266; G03F 7/70308; G03F 7/70316; G03F 7/70483–70541; G03F 7/70591; G03F 7/70808; G03F 7/70816; G03F 7/70833; G03F 7/709; G03F 7/70975; G01B 11/005; G02B 7/023; G02B 7/1827
USPC ............ 355/18, 30, 52–55, 67–77; 359/819; 356/399–401
See application file for complete search history.

(56) References Cited

U.S. PATENT DOCUMENTS

| | | |
|---|---|---|
| 2007/0279768 A1 | 12/2007 | Shibazaki |
| 2008/0123203 A1 | 5/2008 | Onuki et al. |
| 2009/0021847 A1 | 1/2009 | Nawata et al. |
| 2013/0050670 A1* | 2/2013 | Koenen ............... G03F 7/70775 355/67 |
| 2016/0350935 A1* | 12/2016 | Manger ................ G03F 7/7085 |

* cited by examiner

SUPPORTING AN OPTICAL ELEMENT

CROSS-REFERENCE TO RELATED APPLICATIONS

The present application is a continuation of, and claims benefit under 35 USC 120 to, international application PCT/EP2019/075695, filed Sep. 24, 2019, which claims benefit under 35 USC 119 of German Application No. 10 2018 216 344.8, filed Sep. 25, 2018. The entire disclosure of these applications are incorporated by reference herein.

FIELD

The present disclosure relates to an optical arrangement. Furthermore, the disclosure relates to an optical imaging device including such an optical arrangement, to a corresponding method for supporting an optical element, to a corresponding optical imaging method, and to a method for designing a corresponding optical arrangement. The disclosure can be used in conjunction with any desired optical imaging methods. It can be used particularly advantageously in the production or the inspection of microelectronic circuits and the optical components used for them (for example optical masks).

BACKGROUND

The optical devices used in conjunction with the production of microelectronic circuits typically include a plurality of optical element units including one or more optical elements, such as lens elements, mirrors or optical gratings, which are arranged in the imaging light path. The optical elements typically cooperate in an imaging process in order to transfer an image of an object (for example a pattern formed on a mask) onto a substrate (for example a so-called wafer). The optical elements are typically combined in one or more functional groups held, if appropriate, in separate imaging units. Particularly in the case of principally refractive systems that operate with a wavelength in the so-called vacuum ultraviolet range (VUV, for example at a wavelength of 193 nm), such imaging units are often formed from a stack of optical modules holding one or more optical elements. The optical modules typically include a supporting structure having a substantially ring-shaped outer supporting unit, which supports one or more optical element holders, the latter in turn holding the optical element.

The ever advancing miniaturization of semiconductor components results in a constant desire for increased resolution of the optical systems used for their production. This desire for increased resolution leads to the desire for an increased numerical aperture (NA) and an increased imaging accuracy of the optical systems.

One approach for obtaining an increased optical resolution consists in reducing the wavelength of the light used in the imaging process. The trend in recent years has fostered the development of systems in which light in the so-called extreme ultraviolet range (EUV) is used, typically at wavelengths of 5 nm to 20 nm, in most cases at a wavelength of approximately 13 nm. In this EUV range it is no longer possible to use conventional refractive optical systems. This is owing to the fact that in this EUV range the materials used for refractive optical systems generally have an absorbance that is too high to achieve acceptable imaging results with the available light power. Consequently, in this EUV range it is desirable to use reflective optical systems for the imaging.

This transition to reflective optical systems having a high numerical aperture (e.g. NA>0.4 to 0.5) in the EUV range results in considerable challenges with regard to the design of the imaging device.

The factors mentioned above can result in very stringent properties with regard to the position and/or orientation of the optical elements participating in the imaging relative to one another and also with regard to the deformation of the individual optical elements in order to achieve a desired imaging accuracy. Moreover it is usually desirable to maintain this high imaging accuracy over operation in its entirety, ultimately over the lifetime of the system.

As a consequence, the components of the optical imaging device (that is to say, for example, the mask, the optical elements and the substrate) which cooperate during the imaging are typically supported in a well-defined manner in order to maintain a predefined well-defined spatial relationship between these components and to reduce undesired deformation of these components in order ultimately to achieve high imaging quality.

In order to maintain this predefined spatial relationship between the components over the entire imaging process, it is customary in the case of such optical imaging devices to detect this spatial relationship at least intermittently and to actively adjust at least individual components from among the components in a manner dependent thereon in at least one degree of freedom (up to all six degrees of freedom in space). A comparable situation is often applicable with regard to the deformation of individual components. Moreover, it is typical to move the mask and the substrate from time to time in order to image different regions of the pattern of the mask onto different regions of the substrate.

In this case, a relevant factor for the quality of the circuits produced is typically the so-called line-of-sight accuracy or the so-called overlay (that is to say, therefore, the accuracy of the alignment of individual structures of the circuits). In this case, errors in the position and/or orientation of the optical elements used in different degrees of freedom typically affect the resulting imaging accuracy to different extents. Therefore, primarily in the degrees of freedom in which errors have an appreciable effect on the imaging accuracy, it is usually desirable to realize particularly high-performance mirror control loops which in particular suppress disturbances as well as possible or achieve a sufficiently precise positioning and/or orientation of the components participating in the imaging with respect to one another or with respect to their respective reference points or reference structures.

The detection devices (that is to say, for example, measuring devices such as interferometers, encoders, etc.) used for the control loops are typically supported by reference structures (often referred to as metrology frames) which in reality do not behave as rigid bodies but rather, owing to external or internal mechanical disturbances (vibrations, etc.), are subjected to more or less severe deformations (in particular so-called quasi-static deformations) which the optical components used, in particular the optical elements used, are certainly not intended to follow. In this context, an issue is to identify or to detect which portion of the signals of the measuring devices used results from such deformations of the associated reference structure, and to compensate for this measurement error in order to keep the imaging quality as high as possible.

Comparable issues often exist with regard to the actuating devices used for the control loops (that is to say, for example, the actuators used for actively setting the relevant optical elements in one or more degrees of freedom).

SUMMARY

The disclosure seeks to provide an optical arrangement, an optical imaging device, a method for supporting an optical element, an imaging method and a method for designing an imaging device which do not have the above-mentioned disadvantages, or have them at least to a lesser extent, and in particular enable a high imaging quality to be reliably maintained in a simple manner.

The disclosure is based on the technical teaching that, in the case of an optical arrangement of the type mentioned in the introduction, a high imaging quality can be realized in a simple manner if the detection device and the optical element unit are configured in their interplay in such a way that a transformation matrix representing the transformation or conversion of the signals of the detection device into the detection values used in the control with respect to the position and/or orientation of a reference (that is to say, for example, of a reference point) of the optical element has a condition number of 5 to 30 (e.g., 5 to 20, 8 to 15). A comparable situation is applicable if, additionally or alternatively, the actuating device and the optical element unit are configured in their interplay in such a way that a transformation matrix representing the transformation or conversion of the actuating states at the actuating units of the actuating device into the situation values resulting from the control with respect to the position and/or orientation of a reference (that is to say, for example, of a reference point) of the optical element has a condition number of 5 to 30 (e.g., 5 to 20, 8 to 15).

Here, the condition number is a measure of the conditioning of the transfer system. The latter is typically conditioned all the better, the smaller the ratio between the largest and the smallest singularity of the transformation matrix. Consequently, it thus holds true that the conditioning of the system is all the better, consequently for example its noise gain of the control loop thus turns out to be all the lower, the smaller the condition number. Typically, a value of the condition number of CN=1 is therefore striven for.

In other words, the condition number is a measure of the quality of the transfer system. A large condition number means that the matrix of the transfer system is almost singular. For a measuring system for determining the position of an object, a large condition number means, for example, that in at least one direction the position of the object can be reconstructed from the measurement values only inaccurately. Analogously, for an actuating system for setting the position of an object, for example, a large condition number means that in at least one direction the position of the object can be set only inaccurately. Small errors (or noise) in the measuring system or actuating system result here in large measurement errors or position errors, respectively.

In the unfavourable extreme case, a singular transformation matrix is present, the determinant of which is then equal to zero or the rows and/or columns of which are linearly dependent. In this case, then, for example, at least one direction can no longer be reconstructed at all from the measurement values or the object cannot be adjusted in at least one direction even with great expenditure of force.

By contrast, a transformation matrix typically regarded as ideal or worthwhile striving for therefore has the condition number CN=1. In this case, a measurement error is not amplified or the same force has to be expended in all actuating directions in order to adjust the object.

The disclosure has recognized, however, that as a result of the intentional or targeted deviation of the relevant condition number from the condition number having the value CN=1, striven for typically for control systems, for the case of application in the field of such optical imaging devices, an improved system having an increased imaging quality can be achieved. This is substantially owing to the fact that such systems having the condition number mentioned above can be made significantly more compact and therefore have improved dynamic properties which influence the quality of the control or the realizable minimization of the imaging error.

The condition number CN of a transformation matrix TM is the ratio of the largest singular value $SV_{max}$ of the transformation matrix TM to the smallest singular value $SV_{min}$ of the transformation matrix, i.e.:

$$CN(TM) = \frac{SV_{max}(TM)}{SV_{min}(TM)}. \qquad (1)$$

In this case, the condition number CN can be calculated for example by way of the corresponding eigenvalues $EV_i$ of the matrices $TM^T TM$ or $TM\, TM^T$ (consequently thus using the transposed matrix $TM^T$ of the transformation matrix TM), wherein a simple transposition of the transformation matrix TM is sufficient:

$$SV_i(TM) = \sqrt{EV_i(TM^T TM)} = \sqrt{EV_i(TM\, TM^T)} \qquad (2)$$

It goes without saying here that, in principle, both the detection device or the actuating device and the optical element unit can be correspondingly configured or adapted in order to achieve the desired condition number CN. In this case, ultimately only the optical boundary conditions of the optical element which are defined by use in the imaging device are invariable. In particular, it is possible to modify or correspondingly adapt the components of the optical element unit outside the respective optically used region of the optical surface.

In some embodiments, during the design of the optical arrangement, firstly, a first step involves configuring the optical element unit and the detection device and/or the actuating device in order to achieve the condition number CN desired in each case. It is only then that the corresponding supporting structures and, if appropriate, other adjoining components (for example cooling devices and the like) of the optical imaging device are designed in a second step with the boundary conditions resulting from the first step. It is thereby possible, in a comparatively simple manner, to obtain a system which is optimized with regard to the imaging error.

According to one aspect, therefore, the disclosure relates to an optical arrangement for use in an optical imaging device, in particular for microlithography, including an optical element unit and a detection device and/or an actuating device, wherein the optical element unit includes at least one optical element. The detection device is configured to determine in a plurality of M degrees of freedom in each case a detection value which is representative of a relative position or orientation of an element reference of the optical element in relation to a primary reference of the detection device in the respective degree of freedom. The detection device includes a plurality of N detection units, each of which is configured to output a detection signal which is representative of a distance and/or a displacement of the detection unit in relation to a secondary reference assigned to the optical element and the respective detection unit. The optical element unit and the detection device define a detection transformation matrix which is representative of the transformation of the N detection signals into the M detection values. Additionally or alternatively, the actuating device is configured to set in a plurality of R degrees of freedom in each case a situation value which is representative of a relative position or orientation of an element reference of the optical element in relation to a primary reference of the actuating device in the respective degree of freedom. The actuating device includes a plurality of S actuating units, each of which is configured to generate an actuating state at an interface of the actuating unit with respect to the optical element unit. The optical element unit and the actuating device define an actuating transformation matrix which is representative of the transformation of the S actuating states into the R situation values. Here, the condition number of a transformation matrix is defined by the ratio of the largest singular value of the transformation matrix to the smallest singular value of the transformation matrix. The detection device and/or the optical element unit is configured in such a way that the condition number of the detection transformation matrix is 5 to 30 (e.g., 5 to 20, 8 to 15). Additionally or alternatively, the actuating device and/or the optical element unit is configured in such a way that the condition number of the actuating transformation matrix is 5 to 30 (e.g., 5 to 20, 8 to 15).

It goes without saying that, if appropriate, it is also possible for only the optical element unit or the detection device or the actuating device alone to be adapted in order to obtain the desired condition number CN or the corresponding detection transformation matrix or actuating transformation matrix. Optionally, however, all setting possibilities for the respective pairing (including optical element unit and detection device or actuating device) are utilized. It is particularly advantageous, however, if all these components are adapted jointly.

It goes without saying that, in principle, as many degrees of freedom as desired (up to all six degrees of freedom in space) can be taken into consideration in the respective transformation matrix. Optionally, the degrees of freedom taken into account in the respective transformation matrix are limited to those degrees of freedom which have an appreciable influence on the imaging quality of the imaging device. Consequently, they can thus optionally be limited to those degrees of freedom in which an error during the detection and/or setting constitutes an appreciable proportion of the total error budget of the imaging device. Typically, however, owing to the desire for high accuracy, all six degrees of freedom in space are usually taken into account.

In some variants, the plurality M has therefore the value 2 to 6 (e.g., 4 to 6, 6). Additionally or alternatively, the plurality N can have the value 2 to 6 (e.g., 4 to 6, 6). In principle, a different number of M relevant degrees of freedom and N detection units can be provided. Particularly favourable configurations with comparatively simple assignment arise, however, if the plurality N is at least equal to the plurality M. It goes without saying here that, if appropriate, it is also possible to provide more detection units (N) than relevant or considered degrees of freedom (M) (i.e. N>M), consequently it may thus be the case, if appropriate, that N>6 in order to achieve a certain amount of redundancy of the detection signals (for example in order to be able to detect deformations of the optical element, if appropriate). In this regard, by way of example, at least two detection units can be provided for one or more (in particular for particularly error-relevant) degrees of freedom.

Additionally or alternatively, the plurality R can have the value 2 to 6 (e.g., 4 to 6, 6). Likewise, additionally or alternatively, the plurality S can have the value 2 to 6 (e.g., 4 to 6, 6). Here, too, in principle, a different number of R relevant degrees of freedom and S actuating units can be provided. Particularly favourable configurations with comparatively simple assignment arise in turn, however, if the plurality S is at least equal to the plurality R. However, it goes without saying here, too, that, if appropriate, it is possible to provide more actuating units (S) than relevant or considered situation values or degrees of freedom (R) (i.e. S>R), consequently it may thus be the case that, if appropriate, S>6 in order to obtain a certain amount of redundancy of the actuating units (if appropriate also in order to obtain predefinable deformations of the optical element).

The concentration—already described above—on the degrees of freedom which are relevant with regard to the imaging error is realized in particularly advantageous variants in which the optical imaging device has a predefinable maximum permissible imaging error during operation, wherein the imaging device is configured to use the M detection values (assigned to the M degrees of freedom) for controlling the imaging device, and a detection value error of at least one of the M detection values makes a contribution to the maximum permissible imaging error. In this case, the detection value error of the at least one detection value makes a contribution to the maximum permissible imaging error of at least 0.05% to 1.0% of the maximum permissible imaging error (e.g., 0.1% to 0.8% of the maximum permissible imaging error, 0.1% to 0.4% of the maximum permissible imaging error). Degrees of freedom or detection values whose expected contribution to the maximum permissible imaging error lies below this threshold can be disregarded, that is to say thus may not find their way into the detection transformation matrix. Consequently, error-insensitive degrees of freedom or detection values can thus be excluded from the consideration or not taken into account in the adaptation of the condition number CN. The imaging error of the imaging device can be, for example, the so-called overlay error, that is to say the error in the alignment of structures in different exposure processes.

Additionally or alternatively, it can be provided that a sum of the detection value errors of the M detection values makes a contribution to the maximum permissible imaging error of at least 0.5% to 10% of the maximum permissible imaging error (e.g., at least 1% to 8% of the maximum permissible imaging error, at least 1% to 4% of the maximum permissible imaging error). This ensures that degrees of freedom whose contribution to the total imaging error is not negligible are taken into account in any case.

Additionally or alternatively, the same approach can also be adopted for the actuating device. Optionally, the imaging device is therefore configured to set the R situation values (assigned to the R degrees of freedom) in the control of the imaging device. A situation value error of at least one of the R situation values then makes a contribution to the maximum permissible imaging error, wherein the situation value error of the at least one situation value makes a contribution to the maximum permissible imaging error of at least 0.05% to 1.0% of the maximum permissible imaging error (e.g., at least 0.1% to 0.8% of the maximum permissible imaging error, at least 0.1% to 0.4% of the maximum permissible imaging error). By this approach too, degrees of freedom or situation values whose expected contribution to the maximum permissible imaging error lies below this threshold can be disregarded, that is to say thus may not find their way into the actuating transformation matrix. Consequently, error-insensitive degrees of freedom or situation values can thus be excluded from the consideration or not taken into account in the adaptation of the condition number CN.

Additionally or alternatively, it can in turn also be provided that a sum of the situation value errors of the R situation values makes a contribution to the maximum permissible imaging error of at least 0.5% to 10% of the maximum permissible imaging error (e.g., at least 1% to 8% of the maximum permissible imaging error, at least 1% to 4% of the maximum permissible imaging error). This in turn ensures that degrees of freedom whose contribution to the total imaging error is not negligible are taken into account in any case.

It goes without saying that, in principle, it is possible to consider exclusively the transformation matrix for all detection units and/or actuating units to be taken into account and the assigned degrees of freedom. In advantageous variants, in addition thereto, the transformation matrix for one or more pairs of detection units and/or actuating units is taken into account. This can be particularly advantageous for example if the pairs relate to particularly sensitive degrees of freedom, that is to say thus degrees of freedom in which an error constitutes a particularly high proportion of the imaging error of the imaging device.

In such variants, then, optionally, at least two of the N detection units, in particular each two of the N detection units, form a detection unit pair, wherein each of the detection units of the detection unit pair with its assigned secondary reference defines a detection direction. Optionally, the detection directions of the two detection units of the detection unit pair at least substantially lie in a common detection unit pair plane. The detection unit pair is then configured to determine, in each case, in at least two (e.g., three) detection pair degrees of freedom in the detection unit pair plane a detection pair detection value which is representative of a relative position or orientation of a detection pair element reference—assigned to the detection unit pair—of the optical element in relation to the primary reference in the respective detection pair degree of freedom. The optical element unit and the detection unit pair then define a detection pair transformation matrix which is representative of the transformation of the detection signals of the detection unit pair into the detection pair detection values. Here, too, the detection unit pair and/or the optical element unit is then optionally configured in such a way that the condition number of the detection pair transformation matrix is 5 to 30 (e.g., 5 to 20, 8 to 15). Consequently, by this approach, it is thus possible to achieve a favourable conditioning for the single detection unit pair or a plurality of such detection unit pairs.

In specific advantageous variants, at least one of the detection pair degrees of freedom is a translational degree of freedom and one of the detection pair degrees of freedom is a rotational degree of freedom, since a translational degree of freedom and a rotational degree of freedom of such a pair often have an appreciable influence on the imaging error.

In these variants, the element reference can be arranged, in principle, in any suitable location in relation to the detection unit pair, in particular the detection unit pair plane. In principle, it is particularly advantageous if the element reference of the optical element is arranged at least substantially in the detection unit pair plane. Additionally or alternatively, the element reference of the optical element can coincide at least substantially with the detection pair element reference of the optical element. If this is the case, the conditioning of the detection pair transformation matrix is typically of particular importance.

In specific variants, a particularly favourable conditioning of the system is achieved if a detection direction angle between the detection directions of the detection unit pair is less than 120° (e.g., 60° to 110°, 75° to 95°). In this case, the result is a particularly favourable ratio between the noise gain and the dynamic advantages of the system which arise as a result of the deviation from the ideal condition number (CN=1), the advantages being mentioned in the introduction. The dynamic advantages then more than compensate for the disadvantage resulting from the intentional or targeted deviation from this ideal value of the conditioning.

A comparable situation is applicable in variants in which a plurality of detection unit pairs, in particular three detection unit pairs, are provided and the detection direction angles between the detection directions of the respective detection unit pair deviate from one another by less than 10° to 40° (e.g., less than 5° to 25°, less than 2° to 15°). In this case, particularly favourable variants are obtained if the two secondary references of the detection units of at least one of the detection unit pairs, in particular of all the detection unit pairs, are arranged adjacent to one another. In this case, the secondary references of the detection units can be arranged directly adjacent to one another.

In further variants, a plurality of detection unit pairs are provided, wherein the detection unit pair planes of two detection unit pairs are inclined with respect to one another by less than 5° to 30° (e.g., less than 3° to 15°, less than 1° to 10°). In this case, it can be particularly advantageous if the two detection unit pair planes extend substantially parallel. As a result, particularly favourable configurations can be obtained, particularly if the detection units of the two detection unit pairs cover the same degrees of freedom in a pairwise manner. As explained in even greater detail below, it is thereby possible, in particular, to obtain configurations which are insensitive (or "blind") to oscillations of the supporting structure; consequently the error introduced into the control system as a result of oscillations of the supporting structure can thus be kept small, particularly if the direction of movement of the oscillating supporting structure extends substantially perpendicular to the detection unit pair planes.

It should be noted here that (unless explicit indications to the contrary are given below) the angles between two planes that are indicated in the present application are always measured in a measurement plane extending perpendicular to a line of intersection of the two planes.

In further variants a plurality of detection unit pairs are provided, wherein the detection unit pair planes of two detection unit pairs are inclined with respect to the gravitational force direction by an inclination angle of less than 5° to 30° (e.g., less than 3° to 15°, less than 1° to 10°). It can be particularly advantageous here if the inclination angle with respect to the gravitational force direction is substantially 0°. This results in particularly favourable conditionings with regard to errors in the degrees of freedom along the gravitational force direction. This holds true particularly if the oscillations of the supporting structure are directed substantially perpendicular to the gravitational force direction.

In further variants, a plurality of detection unit pairs are provided, wherein the detection unit pair planes of two detection unit pairs are inclined with respect to the gravitational force direction by an inclination angle and the inclination angles differ from one another by less than 5° to 30° (e.g., less than 3° to 15°, less than 1° to 10°). This small difference in the inclinations of the detection unit pair planes with respect to the gravitational force direction is also particularly favourable with regard to a good conditioning of the system. Specifically, this holds true primarily with regard to errors in the degrees of freedom perpendicular to the gravitational force direction (translation along one degree of freedom perpendicular to the gravitational force direction and tilting or rotation about an axis perpendicular to the gravitational force direction), particularly in the case of the abovementioned oscillations of the supporting structure.

The advantages of the pair formation described above can also be realized in the context of the actuating device. Optionally, therefore, at least two of the S actuating units, in particular each two of the S actuating units, form an actuating unit pair, wherein each of the actuating units of the actuating unit pair defines an actuating direction, and the actuating directions of the two actuating units of the actuating unit pair lie at least substantially in a common actuating unit pair plane. The actuating unit pair is then configured to set in at least two, optionally three, actuating pair degrees of freedom in the actuating unit pair plane in each case a pair situation value which is representative of a relative position or orientation of an actuating pair element reference—assigned to the actuating unit pair—of the optical element in relation to the primary reference in the respective actuating pair degree of freedom. The optical element unit and the detection unit pair then define an actuating pair transformation matrix which is representative of the transformation of the actuating states of the actuating unit pair into the pair situation values. The actuating unit pair and/or the optical element unit in turn is configured in such a way that the condition number of the actuating pair transformation matrix is 5 to 30 (e.g., 5 to 20, 8 to 15).

Here, too, it is optionally provided that at least one of the actuating pair degrees of freedom is a translational degree of freedom and one of the actuating pair degrees of freedom is a rotational degree of freedom. Additionally or alternatively, it can be provided that an actuating direction angle between the actuating directions of the actuating unit pair is less than 120° (e.g., 60° to 110°, 75° to 95°). This, too, is advantageous with regard to as favourable noise behaviour of the control system as possible. The above explanations are also applicable with regard to the location of the element reference. In particular, it is optionally provided that the element reference of the optical element is arranged at least substantially in the actuating unit pair plane. Additionally or alternatively, the element reference of the optical element can coincide at least substantially with the actuating pair element reference of the optical element.

The abovementioned aspects and advantages of taking account of single and a plurality of actuating unit pairs can likewise be manifested. In specific variants, therefore, a plurality of actuating unit pairs, in particular three actuating unit pairs, can be provided wherein the actuating direction angles between the actuating directions of the respective actuating unit pair deviate from one another by less than 10° to 40° (e.g., less than 5° to 25°, less than 2° to 15°). Here, too, it can in turn be provided that the two interface devices of the actuating units of at least one of the actuating unit pairs, in particular of all the actuating unit pairs, are arranged adjacent to one another. Here, too, it is in turn advantageous if the relevant interface units are arranged directly adjacent to one another.

In further variants, a plurality of actuating unit pairs can be provided wherein the actuating unit pair planes of two actuating unit pairs are inclined with respect to one another by less than 5° to 30°, preferably less than 3° to 15°, more preferably less than 1° to 10°. Here, too, it can be particularly advantageous if the actuating unit pair planes extend substantially parallel. Additionally or alternatively, in the case of a plurality of actuating unit pairs, the actuating unit pair planes of two actuating unit pairs can be inclined with respect to the gravitational force direction by an inclination angle of less than 5° to 30°, preferably less than 3° to 15°, more preferably less than 1° to 10°. Here, too, it can be particularly advantageous if the inclination angle with respect to the gravitational force direction is substantially 0°. Likewise, a plurality of actuating unit pairs can be provided, wherein the actuating unit pair planes of two actuating unit pairs are inclined with respect to the gravitational force direction by an inclination angle and the inclination angles differ from one another by less than 5° to 30°, preferably less than 3° to 15°, more preferably less than 1° to 10°. With all these variants, the corresponding advantages mentioned above in respect of the detection unit pairs can also be achieved in the case of the actuating device.

The detection units of the detection device can be supported, in principle, in any suitable manner by way of one or more separate supporting structures. In particularly favourable variants, the support is effected in such a way that eigenfrequencies and resultant eigenforms of the supporting structure are taken into account. In preferred variants, therefore, at least one of the N detection units is supported by a detection device supporting structure of the detection device wherein the detection device supporting structure under oscillation excitation at at least one eigenfrequency has at least one eigenform which is assigned to the eigenfrequency and which has in particular at least one oscillation node.

In this case, the at least one detection unit can be arranged in such a way, in particular can be arranged near to the at least one oscillation node in such a way, that a maximum change in a position and/or orientation of the at least one detection unit in at least one oscillation degree of freedom, in particular in a plurality of oscillation degrees of freedom up to all six oscillation degrees of freedom, at the at least one eigenfrequency generates a change in the detection value of the detection unit relative to a rest state of less than 5% to 10%, preferably less than 2% to 6%, more preferably less than 1% to 4%, of the detection value of the detection unit. Preferably, the change in the detection value of the detection unit relative to a rest state is 0% to 0.5% of the detection value of the detection unit. What can thus be achieved thereby is that the error introduced into the control system as a result of oscillations of the supporting structure can be kept small.

Additionally or alternatively, it can be provided that the at least one detection unit with the assigned secondary reference defines a detection direction, the at least one detection unit at the at least one eigenfrequency has a maximum change in a position and/or orientation in at least one oscillation degree of freedom, and the at least one detection unit is arranged in such a way that the detection direction is inclined with respect to a plane perpendicular to the oscillation degree of freedom exhibiting the maximum change in the position and/or orientation by at most 5° to 30°, preferably at most 3° to 15°, more preferably at most 1° to 10°. As a result, what can advantageously be achieved is that the detection unit or the detection signal supplied by it is insensitive (or "blind") to the oscillation of the supporting structure; consequently, here, too, the error introduced into the control system as a result of oscillation of the supporting structure can thus be kept small.

It should be noted here that this positioning of the at least one detection unit and/or the orientation of the detection direction depending on the eigenform(s) of the supporting structure constitutes in each case an independently protectable disclosure concept which is independent of the herein described setting of the condition number of the detection transformation matrix and the condition number of the actuating transformation matrix, respectively. Nevertheless, if appropriate, the effects and advantages of these inventive concepts can advantageously be combined.

In particular, the indications above and/or below concerning the detection direction angles, the mutual angles between the detection unit pair planes and/or of the detection unit pair planes with respect to the gravitational force direction of the detection device can advantageously be implemented without exception also (without the above stipulations concerning the condition number) individually or in any desired combination with these further inventive concepts. It is particularly advantageous here if as symmetrical a configuration of the detection device as possible is chosen. This holds true in particular for the quality of the control that is achievable as a result. It is particularly advantageous if the symmetry is chosen in relation to a plane of symmetry and/or an axis of symmetry of the optical element.

The same also holds true for an (additional or alternative) combination with the actuating device described above and/or below. Consequently, the above indications concerning the actuating direction angles, the mutual angles between the actuating unit pair planes and/or of actuating unit pair planes with respect to the gravitational force direction can thus also be advantageously implemented without exception also (without the above stipulations concerning the condition number) individually or in any desired combination with these further inventive concepts. Here, too, the above-described symmetrical configuration is particularly advantageous, in particular for the quality of the achievable control.

The supporting structure can be fashioned in any desired manner, in principle, in each of these cases. In particular, a closed frame- or ring-shaped structure can be chosen. In specific variants in which particularly compact configurations that are well adapted to the beam path in the imaging device (that is to say do not block the beam path of the imaging device) are achieved, the detection device supporting structure includes a substantially U-shaped structure for supporting at least one of the N detection units, in particular all N detection units. In association with these open structures, the above variants are particularly advantageous since these open structures typically have comparatively pronounced eigenforms. The advantages mentioned are manifested particularly well if at least one of the N detection units is arranged in the region of a free end of the U-shaped structure.

The advantages and variants just outlined with regard to the support of the detection device can be realized (once again independently of the above stipulations concerning the condition number) in principle in the same way for the actuating device as well. In specific variants, therefore, it is provided that at least one of the R actuating units is supported by an actuating device supporting structure of the actuating device, wherein the actuating device supporting structure under oscillation excitation at at least one eigenfrequency has at least one eigenform which is assigned to the eigenfrequency and which has in particular at least one oscillation node.

In a manner analogous to the explanations above, here as well the at least one actuating unit can be arranged in such a way, in particular can be arranged near to the at least one oscillation node in such a way, that a maximum change in a position and/or orientation of the at least one actuating unit in at least one oscillation degree of freedom, in particular in a plurality of oscillation degrees of freedom up to all six oscillation degrees of freedom, at the at least one eigenfrequency generates a change in the actuating state of the actuating unit relative to a rest state of less than 5% to 10%, preferably less than 2% to 6%, more preferably less than 1% to 4%, of the actuating state of the actuating unit. Preferably, the change in the actuating state of the actuating unit relative to a rest state is 0% to 0.5% of the actuating state of the actuating unit. By this approach, too, what can be achieved is that the error introduced into the control system as a result of oscillations of the supporting structure can be kept small.

Additionally or alternatively, the at least one actuating unit can define an actuating direction, the at least one actuating unit at the at least one eigenfrequency can have a maximum change in a position and/or orientation in at least one oscillation degree of freedom, and the at least one actuating unit can be arranged in such a manner that the actuating direction is inclined with respect to a plane perpendicular to the oscillation degree of freedom with the maximum change in the position and/or orientation by at most 5° to 30°, preferably at most 3° to 15°, more preferably at most 1° to 10°. As a result, what can advantageously be achieved in turn is that the actuating unit or the actuating state generated by it is as insensitive (or "blind") as possible to the oscillation of the supporting structure; consequently, here, too, the error introduced into the control system as a result of oscillation of the supporting structure can thus be kept small.

Here, too, in the case of space-saving variants exhibiting little obstructiveness, it can be provided that the actuating device supporting structure includes a substantially U-shaped structure for supporting at least one of the R actuating units, in particular all R actuating units. Once again the advantages are manifested particularly well if one of the R actuating units is arranged in the region of a free end of the U-shaped structure.

It goes without saying that, in principle, any suitable points or sections of the optical element are appropriate for the element reference of the optical element. Particularly favourable configurations result if the element reference of the optical element is an area centroid of an optical surface of the optical element. Alternatively, the element reference of the optical element can be a mass centroid of the optical element. Likewise, the element reference of the optical element can be a volume centroid of the optical element. Finally, the optical element is provided for use in an imaging device wherein the element reference of the optical element can then be a point of incidence of a central ray of a used light beam of the imaging device. Particularly favourable results can be achieved in all these cases.

In principle, any desired optical elements are appropriate for the optical element. In this regard, a reflective, refractive or diffractive optical element or a stop can be involved. The advantages of the disclosure are manifested particularly well if the optical element is configured for use with UV light, in particular at a wavelength in the vacuum UV range (VUV) or in the extreme UV range (EUV), in particular at a wavelength of 5 nm to 20 nm.

For the detection units, it is possible to use, in principle, any suitable principles of action with which the desired detection signal or the desired detection value can be achieved with sufficient precision. The same applies to the assigned corresponding secondary references. In variants that are preferred because they are simple and highly precise, at least one detection unit, in particular each detection unit, includes an interferometer, wherein the secondary reference then includes in particular a reflective element. Additionally or alternatively, at least one detection unit, in particular each detection unit, can include an encoder, wherein the secondary reference then preferably includes a reflective grating.

For the actuating units, too, it is possible to apply, in principle, any suitable principles of action which satisfy the desired precision imposed in the imaging device. Particularly simple configurations can be obtained if at least one actuating unit, in particular each actuating unit, includes at least one actuator, in particular includes a force actuator and/or a displacement actuator.

The present disclosure furthermore relates to an optical imaging device, in particular for microlithography and/or wafer inspection, including an illumination device having a first optical element group, an object device for receiving an object, a projection device having a second optical element group, and an image device, wherein the illumination device is configured for illuminating the object and the projection device is configured for projecting an image of the object onto the image device. The illumination device and/or the projection device includes at least one optical arrangement according to the disclosure, the optical element of which is part of the relevant optical element group. Preferably, a control device is provided, which is connected to the detection device and the actuating device and is configured to drive the actuating device depending on signals of the detection device. The variants and advantages described above in the context of the optical arrangement according to the disclosure can thereby be realized to the same extent, and so in this respect reference is made to the explanations above.

The present disclosure furthermore relates to a method for supporting an optical element unit having an optical element in an optical imaging device, in particular for microlithography, wherein a detection device having a plurality of N detection units in a plurality of M degrees of freedom determines in each case a detection value which is representative of a relative position or orientation of an element reference of the optical element in relation to a primary reference of the detection device in the respective degree of freedom, wherein each detection unit outputs a detection signal which is representative of a distance and/or a displacement of the detection unit in relation to a secondary reference assigned to the optical element and the respective detection unit. The optical element unit and the detection device define a detection transformation matrix which is representative of the transformation of the N detection signals into the M detection values. Additionally or alternatively, an actuating device having a plurality of S actuating units in a plurality of R degrees of freedom adjusts in each case a situation value which is representative of a relative position or orientation of an element reference of the optical element in relation to a primary reference of the actuating device in the respective degree of freedom. Each actuating unit generates an actuating state at an interface of the actuating unit with respect to the optical element unit. The optical element unit and the actuating device define an actuating transformation matrix which is representative of the transformation of the S actuating states into the R situation values. Here, a condition number of a transformation matrix is once again defined by the ratio of the largest singular value of the transformation matrix to the smallest singular value of the transformation matrix. Herein, the condition number of the detection transformation matrix is 5 to 30, in particular is 5 to 20, more preferably is 8 to 15. Additionally or alternatively, the condition number of the actuating transformation matrix is 5 to 30, in particular is 5 to 20, more preferably is 8 to 15. The variants and advantages described above in the context of the optical arrangement according to the disclosure can also thereby be realized to the same extent, and so in this respect reference is made to the explanations above.

The present disclosure furthermore relates to an optical imaging method, in particular for microlithography and/or wafer inspection wherein an object is illuminated by way of an illumination device having a first optical element group and an imaging of the object on an image device is generated via a projection device having a second optical element group. A method according to the disclosure for supporting an optical element unit is used in the illumination device and/or the projection device, in particular while generating the imaging. The variants and advantages described above in the context of the optical arrangement according to the disclosure can also thereby be realized to the same extent, and so in this respect reference is made to the explanations above.

Finally, the present disclosure relates to a method for designing an optical arrangement for use in an optical imaging device, in particular for microlithography, including an optical element unit and a detection device and/or an actuating device, wherein the optical element unit includes at least one optical element. In this method, the detection device is configured to determine in a plurality of M degrees of freedom in each case a detection value which is representative of a relative position or orientation of an element reference of the optical element in relation to a primary reference of the detection device in the respective degree of freedom. In this case, the detection device includes a plurality of N detection units, each of which is configured to output a detection signal which is representative of a distance and/or a displacement of the detection unit in relation to a secondary reference assigned to the optical element and the respective detection unit. The optical element unit and the detection device define a detection transformation matrix which is representative of the transformation of the N detection signals into the M detection values. Additionally or alternatively, the actuating device is configured to set in a plurality of R degrees of freedom in each case a situation value which is representative of a relative position or orientation of an element reference of the optical element in relation to a primary reference of the actuating device in the respective degree of freedom. In this case, the actuating device includes a plurality of S actuating units, each of which is configured to generate an actuating state at an interface of the actuating unit with respect to the optical element unit. The optical element unit and the actuating device define an actuating transformation matrix which is representative of the transformation of the S actuating states into the R situation values. Here, the condition number of a transformation matrix is defined by the ratio of the largest singular value of the transformation matrix to the smallest singular value of the transformation matrix. The detection device and/or the optical element unit is configured in such a way that the condition number of the detection transformation matrix is 5 to 30, in particular is 5 to 20, more preferably is 8 to 15, wherein, preferably in a first configuration step, the detection device and the optical element unit are configured and, in a subsequent second configuration step, a supporting structure of the detection device and/or a supporting structure of the optical element unit is configured depending on a result of the first configuration step. Additionally or alternatively, the actuating device and/or the optical element unit is configured in such a way that the condition number of the actuating transformation matrix is 5 to 30, in particular is 5 to 20, more preferably is 8 to 15, wherein, preferably, in a first configuration step, the actuating device and the optical element unit are configured and, in a subsequent second configuration step, a supporting structure of the actuating device and/or a supporting structure of the optical element unit is configured depending on a result of the first configuration step. The variants and advantages described above in the context of the optical arrangement according to the disclosure can also thereby be realized to the same extent, and so in this respect reference is made to the explanations above.

Further aspects and exemplary embodiments of the disclosure are evident from the dependent claims and the following description of preferred exemplary embodiments, which relates to the accompanying figures. All combinations of the disclosed features, irrespective of whether or not they are the subject of a claim, lie within the scope of the disclosure.

DETAILED DESCRIPTION

Figure 1:
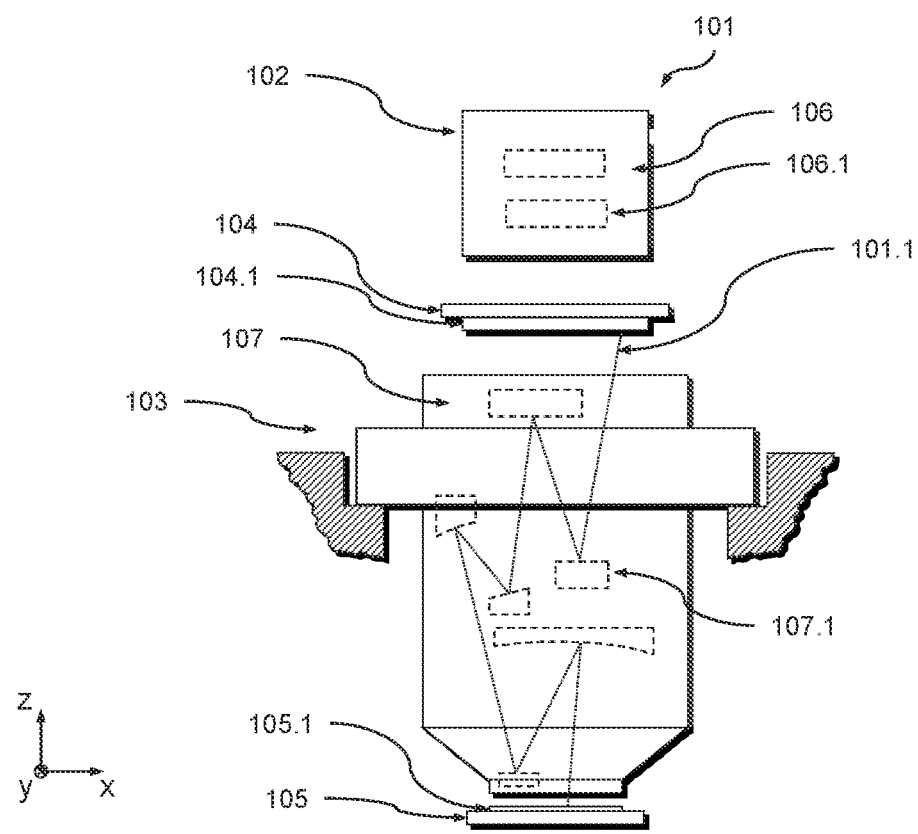
FIG. 1 is a schematic illustration of a preferred embodiment of a projection exposure apparatus according to the disclosure, which includes a preferred embodiment of an optical arrangement according to the disclosure and which can implement the preferred embodiments of the methods according to the disclosure.

A first preferred exemplary embodiment of a projection exposure apparatus 101 according to the disclosure, which includes a preferred exemplary embodiment of an optical module according to the disclosure, is described below with reference to FIGS. 1 to 3. To simplify the following explanations, an x, y, z coordinate system is indicated in the drawings, the z direction corresponding to the direction of gravitational force. It goes without saying that it is possible in further configurations to choose any desired other orientations of an x, y, z coordinate system.

FIG. 1 is a highly schematic, not-to-scale illustration of the projection exposure apparatus 101, which can be used in a microlithographic process for producing semiconductor components. The projection exposure apparatus 101 includes an illumination device 102 and a projection device 103. The projection device 103 is designed to transfer an image of a structure of a mask 104.1, which is arranged in a mask unit 104, onto a substrate 105.1, which is arranged in a substrate unit 105, in an exposure process. To that end, the illumination device 102 illuminates the mask 104.1 (by way of a beam directing device, not illustrated in more specific detail). The optical projection device 103 receives the light from the mask 104.1 and projects the image of the mask structure of the mask 104.1 onto the substrate 105.1, such as for example a wafer or the like.

The illumination device 102 includes an optical element group 106, which has an optical module 106.1. The projection device 103 includes an optical element group 107 having an optical arrangement according to the disclosure in the form of an optical module 107.1. The optical modules 106.1, 107.1 of the optical element groups 106, 107 are arranged along a folded optical beam path 101.1 of the projection exposure apparatus 101. Each of the optical element groups 106, 107 can include a multiplicity of optical modules 106.1, 107.1.

In the present exemplary embodiment, the projection exposure apparatus 101 operates with light in the EUV range (extreme UV range), with wavelengths of between 5 nm and 20 nm, in particular with a wavelength around 13 nm. The optical modules 106.1, 107.1 of the illumination device 102 and of the projection device 103 are therefore exclusively reflective optical elements in the present example. In further configurations of the disclosure, it is of course also possible (in particular depending on the wavelength of the illumination light) to use any type of optical elements (refractive, reflective, diffractive) alone or in any desired combination. In particular, the illumination device 102 and/or the projection device 103 of one or more (if appropriate even all) optical modules can include an arrangement according to the disclosure similar to the module 107.1. In further variants of the disclosure, the imaging device 101 (with corresponding adaptations with regard to the components and their arrangement) can be used for example for inspection purposes, for example for wafer inspection.

Figure 2:
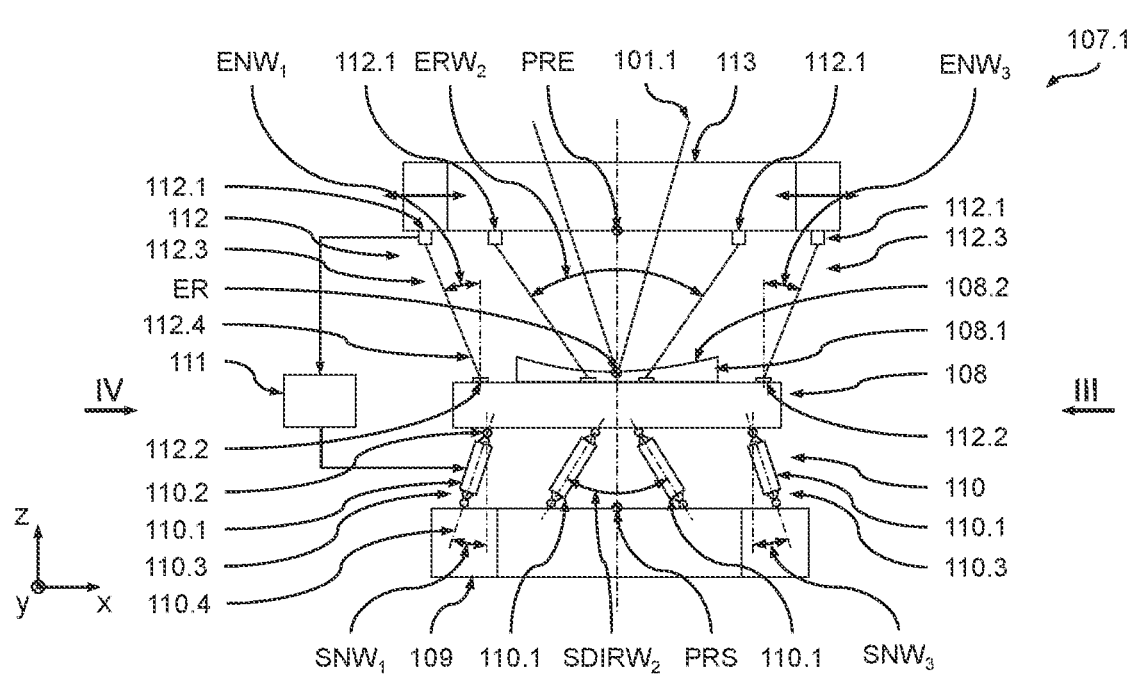
FIG. 2 is a schematic front view of a variant of the optical arrangement according to the disclosure from FIG. 1.

FIG. 2 shows a detail of an exemplary embodiment of an optical module 107.1 according to the disclosure. As can be gathered from FIG. 2, the optical module 107.1 includes an optical element unit 108 and a supporting structure 109 of the projection device 103. The optical element unit 108 includes an optical element 108.1 having an optical surface 108.2 which is at least partly optically used during operation.

The optical element 108.1 is connected to the supporting structure 109 by way of an actuating device in the form of an actuator device 110. The actuating device 110 in this case supports the optical element 108.1 in a statically determinate manner on the supporting structure 109. In order to be able to actively adjust the optical element unit 108 with the optical element 108.1 during operation of the imaging device 101, the actuating device 110 in the present example is configured to set or adjust, respectively, a position and/or orientation of the optical element unit 108 and thus of the optical element 108.1 in all six degrees of freedom DOF in space under the control of a control device 111. It goes without saying that, in other variants, the actuating device 110 can also move the optical element 108.1 only in fewer than six degrees of freedom DOF in space. In particular, the actuating movement can be limited to just two actuated degrees of freedom DOF.

In specific variants, a gravitational force compensation device (not illustrated) can be provided, if appropriate, kinematically parallel to the actuator device 110, the gravitational force compensation device at least substantially taking up the weight force acting on the optical element unit 108, such that during operation the actuator device 110 only has to apply the acceleration forces for the actuating movements at the optical element unit 108.

The optical module 107.1 furthermore includes a detection device 112 configured to determine in a plurality of M degrees of freedom DOF in each case a detection value $EW_i$ ($i=1\ldots M$) which is representative of a relative position or orientation of an element reference ER of the optical element 108.1 in relation to a primary reference PRE of the detection device 112 in the respective degree of freedom DOF.

For this purpose, the detection device 112 includes a plurality of N detection units 112.1, which are supported by a supporting structure 113, typically a so-called metrology frame, of the imaging device 101. Each of the detection units 112.1 is configured to output a detection signal $ES_j$ (j=1 ... N) to the control device 111 (as is illustrated only for one of the detection units 112.1 for reasons of clarity in FIG. 2). The detection values $EW_i$ are then used by the control device 111 during operation of the imaging device 101 to drive the actuating device 110 in accordance with the stipulations of the imaging method carried out, in order to minimize one or more imaging errors of the imaging device 101. Consequently, a control loop RK including the actuating device 110, the control device 111 and the detection device 112 is thus realized.

In this case, the respective detection signal $ES_j$ (j=1 ... N) is representative of a distance and/or a displacement of the detection unit 112.1 in relation to a secondary reference 112.2 assigned to the optical element 108.1 and the respective detection unit 112.1.

For the detection units 112.1, it is possible to use, in principle, any suitable principles of action with which the desired detection signal $ES_j$ or the desired detection value $EW_i$ can be achieved with sufficient precision. The same applies to the assigned corresponding secondary references 112.2. In the present example, all the detection units 112.1 each include an interferometer since high-precision measurements can thereby be carried out in a particularly simple manner. Accordingly, all the secondary references 112.2 include a reflective element (for example an interferometer mirror) connected to the optical element unit 108.

It goes without saying, however, that in other variants it is possible to use any other measurement principles which enable a sufficiently precise measurement. By way of example, individual or all detection units 112.1 can also include an encoder, wherein the secondary reference 112.2 then preferably includes a (one-dimensional or two-dimensional) reflective grating.

In this case, the optical element unit 108 and the detection device 112 define a detection transformation matrix ETM representing the transformation of the N detection signals $ES_j$ into the M detection values $EW_i$. Consequently, the following relationship thus holds true for the vector $\vec{EW_i}$ of the detection values $EW_i$ and the vector $\vec{ES_j}$ of the detection signals $ES_j$:

$$\vec{EW_i} = (ETM)\vec{ES_j} \qquad (3)$$

The detection device 112 and the optical element unit 108 are configured in the present example (as is described in even greater detail below) in such a way that the condition number $CN_{ETM}$ of the detection transformation matrix ETM, the condition number being determined in accordance with equations (1) and (2) above, has the value $CN_{ETM}=11$. In other variants, it can be provided that the condition number $CN_{ETM}$ of the detection transformation matrix ETM is 5 to 30, in particular is 5 to 20, more preferably is 8 to 15.

Here, the condition number $CN_{ETM}$ of the detection transformation matrix ETM is a measure of the conditioning of the transfer system between the input values (that is to say the detection signals $ES_j$) and the output values (that is to say the detection values $EW_i$). The transfer system is typically conditioned all the better, the smaller the deviation between the singularities of the transformation matrix TM. Consequently, it thus holds true that the conditioning of the control system is all the better, consequently for example a noise gain of a control loop thus turns out to be all the lower, the smaller the condition number CN. Typically, a value of the condition number of CN=1 is therefore striven for.

The disclosure has realized, however, that as a result of the intentional or targeted deviation of the condition number $CN_{ETM}$ from the condition number having the value CN=1, striven for typically for control systems, for the case of application in the imaging device 101, an improved system having an increased imaging quality can be achieved. This is substantially owing to the fact that the optical module 107.1 having a condition number $CN_{ETM}$ as defined above can be made significantly more compact and therefore have improved dynamic properties which influence the quality of the control or the realizable minimization of the imaging error.

In addition to this, in the present example, the actuating device 110 is configured to set in a plurality of R degrees of freedom DOF in each case a situation value $LW_p$ (p=1 ... R) which is representative of a relative position or orientation of the element reference ER of the optical element 108.1 in relation a primary reference PRS of the actuating device 110 in the respective degree of freedom. For this purpose, the actuating device 110 includes a plurality of S actuating units 110.1, each of which is configured to generate, under the control of the control device 111, an actuating state $AS_q$ (q=1 ... S) at an interface 110.2 of the actuating unit 110.1 with respect to the optical element unit 108 (as is illustrated only for one of the actuating units 110.1 for reasons of clarity in FIG. 2).

The optical element unit 108 and the actuating device 110 in turn define an actuating transformation matrix STM representing the transformation of the S actuating states $AS_q$ into the R situation values $LW_p$. Consequently, the following relationship thus holds true for the vector $\vec{LW_p}$ of the situation values $LW_p$ and the vector $\vec{AS_q}$ of the actuating states $AS_q$:

$$\vec{LW_p} = (STM)\vec{AS_q} \qquad (4)$$

The actuating device 110 and the optical element unit 108 are configured in the present example (as is described in even greater detail below) in such a way that the condition number $CN_{STM}$ of the actuating transformation matrix STM, the condition number being determined in accordance with equations (1) and (2) above, has the value $CN_{STM}=15$. In other variants, however, it can also be provided that the condition number $CN_{STM}$ is 5 to 30, in particular is 5 to 20, more preferably is 8 to 15.

The disclosure has recognized that also as a result of the intentional or targeted deviation of the condition number $CN_{STM}$ from the condition number having the value CN=1, striven for typically for control systems, for the case of application in the imaging device 101, an improved system having an increased imaging quality can be achieved. This is substantially owing to the fact that the optical module 107.1 also having one of the abovementioned condition numbers $CN_{STM}$ can be made significantly more compact and therefore have improved dynamic properties which influence the quality of the control or the realizable minimization of the imaging error. The above explanations concerning the condition number for the detection device 112 are analogously also applicable to the actuating device 110.

For the actuating units 110.1, too, it is possible to apply, in principle, any suitable principles of action which satisfy the desired precision imposed in the imaging device 101. Particularly simple configurations can be obtained if at least one actuating unit 110.1, in particular (in the present example) each actuating unit 110.1, includes at least one actuator. This is a force actuator in the present example. However, it is also possible to use any other actuators, in particular displacement actuators, in one or more actuating units 110.1.

It should again be mentioned here that, in principle, both the detection device 112 or the actuating device 110 and the optical element unit 108 can be correspondingly configured or adapted in order to achieve the desired condition number $CN_{ETM}$ or $CN_{STM}$, respectively. In this case, ultimately only the optical boundary conditions of the optical element 108.1 which are defined by use in the imaging device 101 are invariable. In particular, it is possible to modify or correspondingly adapt the components of the optical element unit 108 outside the respective optically used region of the optical surface 108.2.

In the present example, during the design of the optical module 107.1, firstly, a first step involves configuring the optical element unit 108 and the detection device 112 and/or the actuating device 110 in order to achieve the condition number $CN_{ETM}$, respectively $CN_{STM}$ desired in each case. It is only then that the corresponding supporting structures 109 and 113, respectively, and, if appropriate, other adjoining components (for example cooling devices and the like) of the optical imaging device 101 are fashioned in a second step with the boundary conditions resulting from the first step. It is thereby possible, in a comparatively simple manner, to obtain an imaging device 101 which is optimized with regard to the imaging error.

As already explained above, it goes without saying that, in other variants if appropriate, it is also possible for only the optical element unit 108 or the detection device 112 or the actuating device 110 alone to be adapted in order to obtain the desired condition number $CN_{ETM}$ or $CN_{STM}$, respectively, or the corresponding detection transformation matrix ETM or actuating transformation matrix STM. Preferably, as in the present example, however, all setting possibilities for the respective pairing (including optical element unit 108 and detection device 112 or including optical element unit 108 and actuating device 110) are utilized. It is particularly advantageous if all these components 108, 110 and 112 are adapted jointly.

As already mentioned, in principle, as many degrees of freedom as desired (up to all six degrees of freedom in space) can be taken into consideration in the respective transformation matrix ETM or STM. Preferably, the degrees of freedom DOF taken into account in the respective transformation matrix ETM or STM for the respective optical module 107.1 are limited to those degrees of freedom DOF which, in association with movements at the optical module 107.1, have an appreciable influence on the imaging quality of the imaging device 101. Consequently, they can thus preferably be limited to those degrees of freedom DOF in which an error during the detection by the detection device 112 and/or an error during the setting by the actuating device 110 constitutes an appreciable proportion of the total error budget of the imaging device 101.

In the present example, both the detection and the setting are effected in each case in all six degrees of freedom in space. Accordingly, the plurality of degrees of freedom DOF is in the first place M=6 for the detection by way of the detection device 112 and R=6 for the setting by way of the actuating device 110. A plurality of N=6 detection units 112.1 and associated secondary references 112.2 are used in this case. Likewise, a plurality of S=6 actuating units are used, which are arranged as parallel kinematics in the form of a hexapod in the present example.

As already mentioned above, in other variants, however, it can also be provided that the plurality M of degrees of freedom DOF for the detection has the value 2 to 6, preferably 4 to 6, more preferably 6. Likewise, the plurality N of detection units 112.1 can have the value 2 to 6, preferably can be 4 to 6, more preferably 6. In principle, a different number of M relevant degrees of freedom DOF and N detection units 112.1 can be provided. Particularly favourable configurations with comparatively simple assignment arise, however, if, as in the present example, the plurality N is at least equal to the plurality M. Moreover, as mentioned, the following can also hold true: N>M.

Likewise, the plurality R of degrees of freedom DOF for the setting can have the value 2 to 6, preferably can be 4 to 6, more preferably 6. Here, too, the plurality S of actuating units 110.1 has the value 2 to 6, preferably can be 4 to 6, more preferably 6. Here, too, in principle, a different number of R relevant degrees of freedom DOF and S actuating units 110.1 can be provided. Particularly favourable configurations with comparatively simple assignment once again arise, however, if, as in the present example, the plurality S is at least equal to the plurality R.

The concentration—already described above—on the degrees of freedom DOF that are relevant with regard to the imaging error is realized in particularly advantageous variants. In this case, the optical imaging device 101 has a predefinable maximum permissible imaging error $IE_{max}$ during operation. Furthermore, the imaging device 101 is configured to use the M detection values $EW_i$ (assigned to the M degrees of freedom DOF) for controlling the imaging device 101 via the control device 111, wherein a detection value error $FEW_i$ of at least one of the M detection values EW1 then makes a contribution $BEW_i$ to the maximum permissible imaging error $IE_{max}$.

In this case, the detection value error $FEW_i$ of the at least one detection value $EW_i$ makes a contribution $BEW_i$ to the maximum permissible imaging error $IE_1$ of at least 0.05% to 1.0% of the maximum permissible imaging error $IE_{max}$, preferably at least 0.1% to 0.8% of the maximum permissible imaging error $IE_{max}$, more preferably at least 0.1% to 0.4% of the maximum permissible imaging error $IE_{max}$. Degrees of freedom DOF or detection values $EW_i$ whose expected contribution $BEW_i$ to the maximum permissible imaging error $IE_{max}$ lies below this threshold can be disregarded, consequently thus may not find their way into the detection transformation matrix ETM. Consequently, error-insensitive degrees of freedom DOF or detection values $EW_i$ can thus be excluded from the consideration or not taken into account in the adaptation of the condition number $CN_{ETM}$.

Furthermore, in specific variants, it can be provided that a sum $SFEW_i$ of the detection value errors FEW' of the M detection values EW1 makes a contribution $SBEW_i$ to the maximum permissible imaging error $IE_{max}$ of at least 0.5% to 10% of the maximum permissible imaging error $IE_{max}$, preferably at least 1% to 8% of the maximum permissible imaging error $IE_{max}$, more preferably at least 1% to 4% of the maximum permissible imaging error $IE_{max}$. This ensures that degrees of freedom DOF whose contribution to the total imaging error $IE_{max}$ is not negligible are taken into account in any case.

In specific variants, the same procedure can also be adopted for the actuating device 110. In these cases, the imaging device 101 is configured to set the R situation values $LW_p$ (assigned to the R degrees of freedom) during the control of the imaging device 101 by the control device 111. A situation value error $FLW_p$ of at least one of the R situation values $LW_p$ then makes a contribution $BLW_p$ to the maximum permissible imaging error $IE_{max}$, wherein the situation value error $FLW_p$ of the at least one situation value $LW_p$ makes a contribution $BLW_p$ to the maximum permissible imaging error $IE_{max}$ of at least 0.05% to 1.0% of the maximum permissible imaging error $IE_{max}$, preferably at least 0.1% to 0.8% of the maximum permissible imaging error $IE_{max}$, more preferably at least 0.1% to 0.4% of the maximum permissible imaging error $IE_{max}$. By this approach, too, degrees of freedom DOF or situation values $LW_p$ whose expected contribution $BLW_p$ to the maximum permissible imaging error $IE_{max}$ lies below this threshold can be disregarded, consequently thus may not find their way into the actuating transformation matrix STM. Consequently, error-insensitive degrees of freedom DOF or situation values $LW_p$ can thus be excluded from the consideration or not be taken into account in the adaptation of the condition number CN.

Furthermore, in specific variants, it can once again be provided that a sum $SFLW_p$ of the situation value errors $FLW_p$ of the R situation values $LW_p$ makes a contribution $SBLW_p$ to the maximum permissible imaging error $IE_{max}$ of at least 0.5% to 10% of the maximum permissible imaging error $IE_{max}$, preferably at least 1% to 8% of the maximum permissible imaging error $IE_{max}$, more preferably at least 1% to 4% of the maximum permissible imaging error $IE_{max}$. This once again ensures that degrees of freedom DOF whose contribution $BLW_p$ to the total imaging error $IE_{max}$ is not negligible are taken into account in any case.

It goes without saying that, in principle, it is possible to consider exclusively the transformation matrix ETM or STM for all detection units 112.1 and/or actuating units 110.1 to be taken into account and the assigned degrees of freedom DOF. In the present example, in addition thereto, the transformation matrix for one or more pairs of detection units 112.1 and/or actuating units 110.1 is taken into account. This can be particularly advantageous for example if the pairs relate to particularly sensitive degrees of freedom DOF, that is to say thus degrees of freedom DOF in which an error constitutes a particularly high proportion of the imaging error of the imaging device 101.

Figure 3:
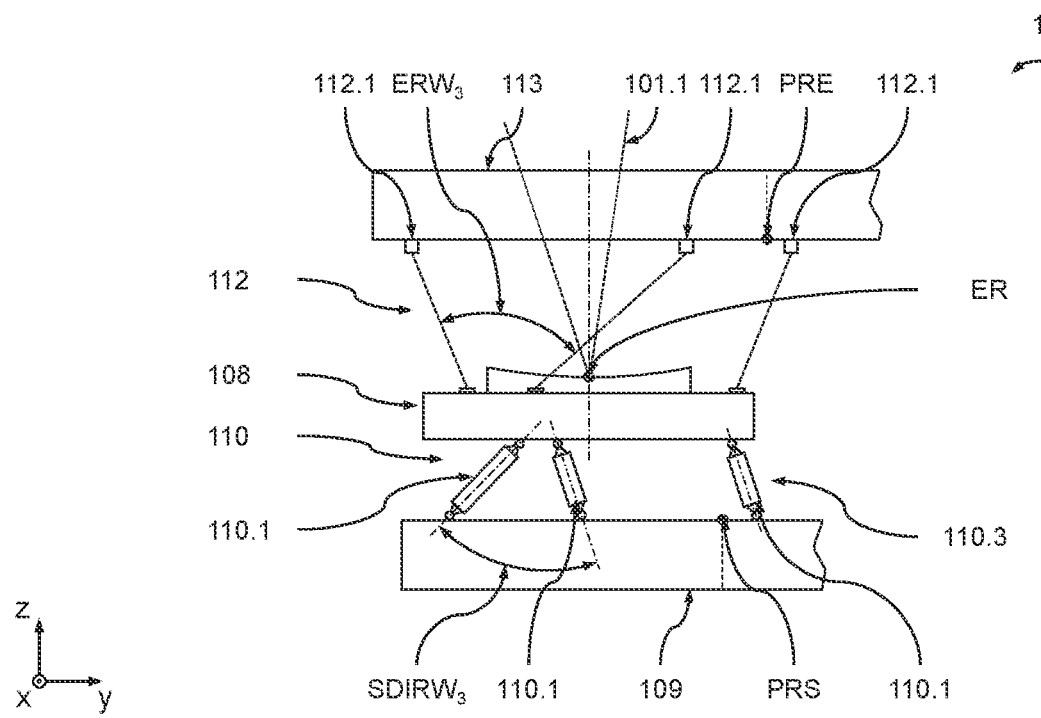
FIG. 3 is a schematic side view of the optical arrangement from FIG. 2 from the direction III from FIG. 2.
Figure 4:
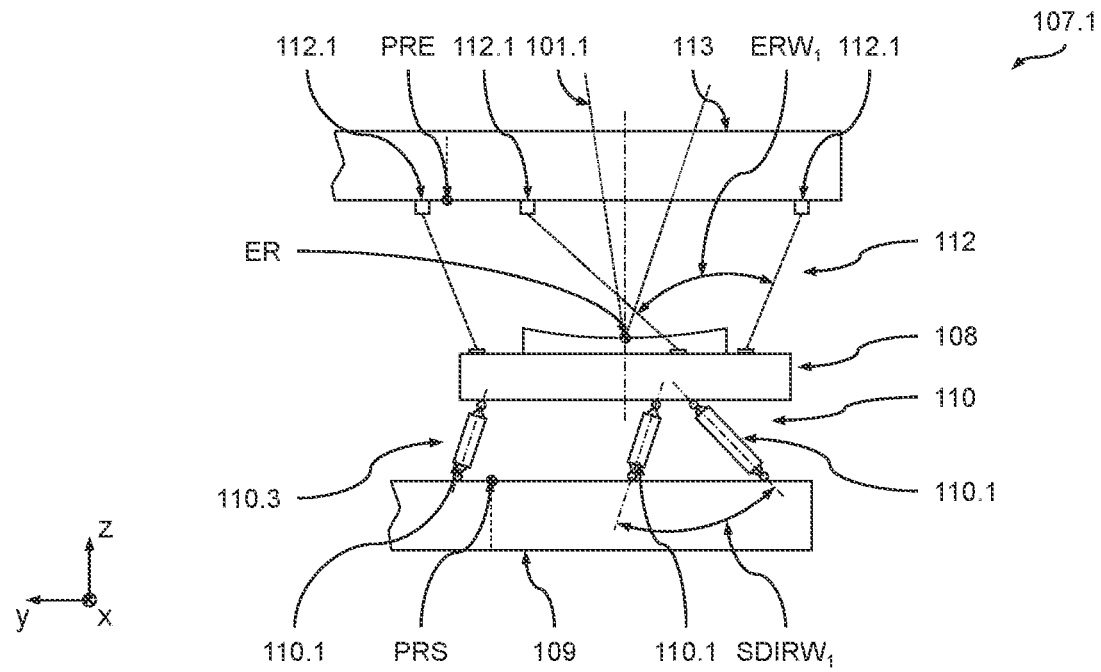
FIG. 4 is a schematic side view of the optical arrangement from FIG. 2 from the direction IV from FIG. 2.

In such variants, then, preferably, at least two of the N detection units 112.1 form a detection unit pair 112.3, wherein each of the detection units 112.1 of the detection unit pair 112.3 with the assigned secondary reference 112.2 thereof defines a detection direction EDIR, which is indicated in FIGS. 2 to 4 in each case by the dashed line 112.4 of the beam of the interferometer 112.1. In the present example, in each case two adjacent detection units 112.1 form a detection unit pair 112.4, with the result that a total of three detection unit pairs 112.4 are formed.

In the present example, the detection directions EDIR of the two detection units 112.1 of the detection unit pair 112.3 lie substantially in a common detection unit pair plane EEPE. In this case, the detection unit pair 112.3 is configured to determine in at least two detection pair degrees of freedom EPDOF, in the present example in three detection pair degrees of freedom EPDOF, in the detection unit pair plane EEPE in each case a detection pair detection value $EPEW_i$ (i=1 . . . 3) which is representative of a relative position or orientation of a detection pair element reference EPER of the optical element 108.1, the detection pair element reference being assigned to the detection unit pair, in relation to the primary reference PRE in the respective detection pair degree of freedom EPDOF.

The optical element unit 108 and the detection unit pair 112.3 then define a detection pair transformation matrix EPETM which is representative of the transformation of the detection signals $EPES_j$ of the detection unit pair 112.3 into the detection pair detection values $EPEW_i$. Consequently, the following relationship thus holds true for the vector $\overrightarrow{EPEW_i}$ of the detection values $EPEW_i$ and the vector $\overrightarrow{EPES_j}$ of the detection signals $EPES_j$:

$$\overrightarrow{EPEW_i} = (EPETM)\overrightarrow{EPES_j} \qquad (5)$$

In the present example, the detection device 112 and the optical element unit 108 are configured in such a way that the condition number $CN_{EPETM}$ of the detection pair transformation matrix EPETM, the condition number being determined in accordance with equations (1) and (2) above, has the value $CN_{EPETM}=10$. In other variants, it can be provided that the condition number $CN_{EPETM}$ of the detection pair transformation matrix EPETM is 5 to 30, in particular is 5 to 20, more preferably is 8 to 15. Consequently, by this approach it is thus possible to achieve a favourable conditioning for the single detection unit pair 112.3 or a plurality of such detection unit pairs 112.3.

In the present example, the detection pair degrees of freedom EPDOF are naturally the two translational degrees of freedom and the rotational degree of freedom in the detection unit pair plane EEPE. It goes without saying, however, that, in other variants, it is also possible only to take account of the two detection pair degrees of freedom EPDOF which have a significant influence on the imaging error.

In these variants, the element reference ER can be arranged, in principle, in any suitable location in relation to the detection unit pair 112.3, in particular the detection unit pair plane EEPE. In principle, it is particularly advantageous if the element reference ER of the optical element 108.1 is arranged at least substantially in the detection unit pair plane EEPE. Additionally or alternatively, the element reference ER of the optical element 108.1 can coincide at least substantially with the detection pair element reference EPER of the optical element 108.1. If this is the case, the conditioning of the detection pair transformation matrix EPETM is typically of particular importance. In the present example, however, one of the two secondary references 112.2 of the detection unit pair 112.3 constitutes the detection pair element reference EPER, since it is thereby possible to obtain a particularly simple configuration.

In the present example, a particularly favourable conditioning of the system is achieved by the detection direction angle $ERW_i$ (i=1 . . . 3) between the detection directions EDIR of the detection unit pair 112.3 being less than 120°, preferably being 60° to 110°, more preferably being 75° to 95°. In this case, this results in a particularly favourable ratio between the noise gain and the dynamic advantages of the optical module 107.1 which arise as a result of the deviation from the ideal condition number (CN=1), the advantages being mentioned in the introduction. The latter then more than compensate for the disadvantage resulting from the targeted deviation from this ideal value of the conditioning.

In the present variants with three detection unit pairs 112.3, it is additionally provided that the detection direction angles $ERW_i$ between the detection directions EDIR of the respective detection unit pair 112.3 deviate from one another by less than 10° to 40°, preferably less than 5° to 25°, more preferably less than 2° to 15°.

Particularly favourable results are achieved in this case since the two secondary references 112.2 of the detection units 112.1 of all the detection unit pairs 112.3 are arranged adjacent to one another. In this case, it is particularly advantageous that the secondary references 112.2 of the detection units 112.1 are arranged directly adjacent to one another.

Furthermore, in the present example, the detection unit pair planes EEPE of the first and third detection unit pairs 112.3 (see left and right detection unit pairs 112.3 with $ERW_1$ and $ERW_3$ in FIG. 2) are inclined with respect to one another by less than 5° to 30°, preferably less than 3° to 15°, more preferably less than 1° to 10°. Particularly favourable configurations can be achieved as a result, particularly if the detection units 112.1 of the two detection unit pairs 112.3, as in the present case, cover the same degrees of freedom DOF in a pairwise manner.

As explained in even greater detail below, it is thereby possible, in particular, to obtain configurations which are insensitive (or "blind") to oscillations of the supporting structure 113; consequently the error introduced into the control system as a result of oscillations of the supporting structure 113 can thus be kept small, particularly if the direction of movement of the oscillating supporting structure 113 extends substantially perpendicular to the detection unit pair planes EEPE.

Furthermore, in the present example, the detection unit pair planes EEPE of the first and third detection unit pair 112.3 are inclined with respect to the gravitational force direction (z-axis) by an inclination angle $ENW_1$ and $ENW_3$, respectively, of less than 5° to 30°, preferably less than 3° to 15°, more preferably less than 1° to 10°. This results in particularly favourable conditionings with regard to errors in the degrees of freedom DOF along the gravitational force direction (z-axis). Moreover, the inclination angles $ENW_1$ and $ENW_3$ differ from one another by less than 5° to 30°, preferably less than 3° to 15°, more preferably less than 1° to 10°. This, too, is particularly favourable with regard to a good conditioning of the optical module 107.1 and thus of the entire imaging device 101. In particular, this holds true with regard to errors in the degrees of freedom perpendicular to the gravitational force direction (e.g. translation along the x-axis and tilting or rotation about the y-axis in FIG. 2), particularly in the case of the abovementioned oscillations of the supporting structure.

The above-described, as symmetrical a configuration of the detection device 112 as possible is particularly advantageous for the quality of the control which is achievable with the control device 111. It is particularly advantageous if, as in the present example, the symmetry is chosen relative to the plane of symmetry (the yz-plane in the present example) of the optical element 108.1.

The advantages of the pair formation described above are also realized in the present example in association with the actuating device 110. In the present example, therefore, at least two of the S actuating units 110.1, to put it more precisely in each case two of the S actuating units 110.1, form an actuating unit pair 110.3, with the result that overall once again three actuating unit pairs 110.3 are formed. Each of the actuating units 110.1 of the actuating unit pair 110.3 defines an actuating direction SDIR corresponding to the longitudinal axis 110.4 of the respective actuating unit 110.1. In the present example, the actuating directions SDIR of the two actuating units 110.1 of the actuating unit pair 110.3 lie at least substantially in a common actuating unit pair plane SEPE.

The respective actuating unit pair 110.3 is furthermore configured to set in at least two, in the present case three, actuating pair degrees of freedom SPDOF in the actuating unit pair plane SEPE in each case a pair situation value $SPLW_p$ (p=1 . . . 3) which is representative of a relative position or orientation of an actuating pair element reference SPER of the optical element 108.1, the actuating pair element reference being assigned to the actuating unit pair 110.3, in relation to the primary reference PRS in the respective actuating pair degree of freedom SPDOF.

The optical element unit 108 and the actuating unit pair 110.3 then define an actuating pair transformation matrix SPSTM which is representative of the transformation of the actuating states $SPAS_q$ of the actuating unit pair 110.3 into the pair situation values $SPLW_p$. Consequently, the following relationship thus holds true for the vector $SPLW_p$ of the situation values $SPLW_p$ and the vector $SPAS_q$ of the actuating states $SPAS_q$:

$$\overrightarrow{SPLW_p} = (SPSTM)\overrightarrow{SPAS_q} \qquad (6)$$

The actuating unit pair 110.3 and/or the optical element unit 108 is once again configured in such a way that the condition number $CN_{SPSTM}$ of the actuating pair transformation matrix SPSTM, the condition number being determined in accordance with equations (1) and (2) above, has the value $CN_{SPSTM}$=8. In other variants, however, it can also be provided that the condition number $CN_{SPSTM}$ of the actuating pair transformation matrix SPSTM is 5 to 30, in particular is 5 to 20, more preferably is 8 to 15.

Here, too, it is naturally provided that two of the actuating pair degrees of freedom SPDOF are the translational degrees of freedom in the actuating unit pair plane SEPE, while the third actuating pair degree of freedom is the rotational degree of freedom in the actuating unit pair plane SEPE. Here, too, however, in other variants, of course, it is also possible for only two of the degrees of freedom to be taken into account.

In the present example, the actuating direction angle $SDIRW_i$ (i=1 . . . 3) between the actuating directions SDIR of the respective actuating unit pair 110.3 is less than 120°, is preferably 60° to 110°, more preferably is 75° to 95°. This is also advantageous with regard to as favourable noise behaviour of the control system is possible. The above explanations are also applicable with regard to the location of the element reference SPER. In particular, it is preferably provided that the element reference ER of the optical element 108.1 is arranged at least substantially in the actuating unit pair plane SEPE. Additionally or alternatively, the element reference ER of the optical element 108.1 can coincide at least substantially with the actuating pair element reference SPER of the optical element 108.1. In the present example, however, one of the two interface devices 110.2 of the actuating element pair 110.3 constitutes the actuating pair element reference SPER, since a particularly simple configuration can thereby be obtained.

Furthermore, the actuating direction angles $SDIRW_i$ between the actuating directions of the respective actuating unit pair 110.3 deviate from one another by less than 10° to 40°, preferably less than 5° to 25°, more preferably less than 2° to 15°. Furthermore, the two interface devices 110.2 of the actuating units 110.1 of all the actuating unit pairs 110.3 are arranged adjacent to one another. Here, too, it is once again advantageous that the relevant interface units 110.2 are arranged directly adjacent to one another.

Moreover, in the present example, the actuating unit pair planes of the first and third actuating unit pairs 110.3 (see left and right detection unit pairs 112.3 with $SDIRW_i$ and $SDIRW_3$ in FIG. 2) are advantageously inclined with respect to one another by less than 5° to 30°, preferably less than 3° to 15°, more preferably less than 1° to 10°. In addition, the actuating unit pair planes of two actuating unit pairs are inclined with respect to the gravitational force direction by an inclination angle $SNW_1$ and $SNW_3$, respectively, of less than 5° to 30°, preferably less than 3° to 15°, more preferably less than 1° to 10°. Likewise, the inclination angles $SNW_1$ and $SNW_3$ differ from one another by less than 5° to 30°, preferably less than 3° to 15°, more preferably less than 1° to 10°. With all these variants, the corresponding advantages mentioned above concerning the detection unit pairs 110.3, can be achieved in the case of the actuating device 110 as well.

The detection units 112.1 of the detection device 112 can be supported, in principle, in any suitable manner by way of one or more separate supporting structures 113. In this case, the support is preferably effected in such a way that eigenfrequencies and resultant eigenforms of the supporting structure 113 are taken into account. In the present example, therefore, the supporting structure 113 forms a detection device supporting structure having, under oscillation excitation at at least one eigenfrequency EEFREQ at least one eigenform EEFORM which is assigned to the eigenfrequency and which has, in particular, at least one oscillation node EVN.

In the present example, at least one of the detection units 112.1 is arranged near to the at least one oscillation node EVN in such a way that a maximum change in a position and/or orientation of the detection unit 112.1 in at least one oscillation degree of freedom VDOF, in particular in a plurality of oscillation degrees of freedom up to all six oscillation degrees of freedom, at the at least one eigenfrequency EEFREQ, generates a change in the detection value $EW_i$ of the detection unit relative to a rest state of less than 5% to 10%, preferably less than 2% to 6%, more preferably less than 1% to 4%, of the detection value $EW_i$ of the detection unit 112.1. Consequently, what can be achieved thereby is that the error introduced into the control system as a result of oscillations of the supporting structure 113 can be kept small.

Furthermore, at least one of the detection units 112.1 at the at least one eigenfrequency EEFREQ has a maximum change in a position and/or orientation in at least one oscillation degree of freedom VDOF, wherein the relevant detection unit 112.1 is then arranged in such a way that the detection direction EDIR is inclined with respect to a plane perpendicular to the oscillation degree of freedom VDOF (indicated by the double-headed arrows in FIG. 2) with the maximum change in the position and/or orientation by at most 5° to 30°, preferably at most 3° to 15°, more preferably at most 1° to 10°. As a result, what advantageously be achieved is that the detection unit 112.1 or the detection signal $ES_j$ supplied by it is insensitive (or "blind") to the oscillation of the supporting structure 113; consequently, here, too, the error introduced into the control system as a result of oscillation of the supporting structure 113 can thus be kept small.

The supporting structure 113 can be fashioned in any desired manner, in principle. In particular, a closed frame- or ring-shaped structure can be involved. In the present example, a particularly compact configuration that is well adapted to the beam path 101.1 in the imaging device 101 (that is to say it does not block the beam path 101.1 of the imaging device 101) is achieved by virtue of the supporting structure 113 including a substantially U-shaped structure for supporting the detection units 112.1. In association with these open structures, the above variants are particularly advantageous since these open structures typically have comparatively pronounced eigenforms EFORM. The advantages mentioned are manifested particularly well if at least one of the N detection units is arranged in the region of a free end of the U-shaped structure, as is the case in the present example for the left detection unit 112.1 in FIG. 3 and for the right detection unit 112.1 in FIG. 4.

The advantages and variants just outlined with regard to the support of the detection device 112 can be realized in principle in the same way for the actuating device 110 as well. In the present example, the supporting structure 109 forms an actuating device supporting structure having, under oscillation excitation at at least one eigenfrequency SEFREQ, at least one eigenform SEFORM which is assigned to the eigenfrequency SEFREQ and which has, in particular at least one oscillation node SVN.

In a manner analogous to the explanations above, here as well the at least one actuating unit 110.1 can be arranged near to the at least one oscillation node in such a way, that a maximum change in a position and/or orientation of the at least one actuating unit 110.1 in at least one oscillation degree of freedom VDOF, in particular in a plurality of oscillation degrees of freedom VDOF through to all six oscillation degrees of freedom VDOF, at the at least one eigenfrequency SEFREQ generates a change in the actuating state $AS_q$ of the actuating unit 110.1 relative to a rest state of less than 5% to 10%, preferably less than 2% to 6%, more preferably less than 1% to 4%, of the actuating state $AS_q$ of the actuating unit 110.1. By this approach, too, what can be achieved is that the error introduced into the control system as a result of oscillations of the supporting structure 109 can be kept small.

Moreover, the at least one actuating unit 110.1 at the at least one eigenfrequency SEFEQ can have a maximum change in a position and/or orientation in at least one oscillation degree of freedom VDOF, and the at least one actuating unit can be arranged in such a manner that the actuating direction SDIF thereof is inclined with respect to a plane perpendicular to the oscillation degree of freedom VDOF with the maximum change in the position and/or orientation by at most 5° to 30°, preferably at most 3° to 15°, more preferably at most 1° to 10°. As a result, what can advantageously be achieved in turn is that the actuating unit 110.1 or the actuating state $AS_q$ generated by it is as insensitive (or "blind") as possible to the oscillation of the supporting structure 109; consequently, here, too, the error introduced into the control system as a result of oscillation of the supporting structure 109 can thus be kept small.

Here, too, in the case of space-saving variants exhibiting little obstructiveness, it can be provided that the supporting structure 109, as in the present example, includes a substantially U-shaped structure 109 for supporting the actuating units 110.1. Once again the advantages are manifested particularly well if one of the actuating units 110.1 is arranged in the region of a free end of the U-shaped structure 109, as is the case in the present example for the left actuating unit 110.1 in FIG. 3 and for the right actuating unit 110.1 in FIG. 4.

In principle, any suitable points or sections of the optical element 108.1 are appropriate for the element reference ER of the optical element 108.1. Particularly favourable configurations arise if the element reference ER of the optical element is an area centroid of the optical surface 108.2 of the optical element 108.1. Alternatively, the element reference ER of the optical element 108.1 can be a mass centroid of the optical element 108.1. Likewise, the element reference ER of the optical element 108.1 can be a volume centroid of the optical element 108.1.

In the present example, the element reference ER of the optical element 108.1 is a point of incidence of a central ray of a used light beam of the imaging device 101, the used light beam being indicated by the optical beam path 101.1.

It goes without saying that with the present example of the imaging device 101 it is possible to carry out the above-described method according to the disclosure for supporting the optical element 108, and the imaging method described above.

The present disclosure has been described above on the basis of an example from the field of microlithography. It goes without saying, however, that the disclosure can also be used in connection with any other desired optical applications, in particular imaging methods at other wavelengths.

Furthermore, the disclosure can be used in connection with the inspection of objects, such as for example so-called mask inspection, in which the masks used for microlithography are inspected for their integrity, etc. In FIG. 1, a sensor unit, for example, which detects the imaging of the projection pattern of the mask 104.1 (for further processing), then takes the place of the substrate 105.1. This mask inspection can then take place both substantially at the same wavelength as is used in the later microlithographic process. However, it is likewise possible also to use any desired wavelengths deviating therefrom for the inspection.

Finally, the present disclosure has been described above on the basis of specific exemplary embodiments showing specific combinations of the features defined in the following patent claims. It should expressly be pointed out at this juncture that the subject matter of the present disclosure is not restricted to these combinations of features, rather all other combinations of features such as are evident from the following patent claims also belong to the subject matter of the present disclosure.

What is claimed is:

1. An optical arrangement, comprising:
   an optical element unit comprising an optical element; and
   a detection device configured to determine in a plurality of M degrees of freedom in each case a detection value which is representative of a relative position or orientation of an element reference of the optical element in relation to a primary reference of the detection device in the respective degree of freedom,
   wherein:
      the detection device comprises a plurality of N detection units, each of which is configured to output a detection signal which is representative of a distance and/or a displacement of the detection unit in relation to a secondary reference assigned to the optical element and the respective detection unit;
      the optical element unit and the detection device define a detection transformation matrix which is representative of the transformation of the N detection signals into the M detection values;
      a condition number of a transformation matrix is defined by a ratio of a largest singular value of the transformation matrix to a smallest singular value of the transformation matrix;
      the detection device and/or the optical element unit is configured so that the condition number of the detection transformation matrix is 5 to 30.

2. The optical arrangement of claim 1, further comprising an actuating device, wherein:
   the actuating device is configured to set in a plurality of R degrees of freedom in each case a situation value which is representative of a relative position or orientation of an element reference of the optical element in relation to a primary reference of the actuating device in the respective degree of freedom;
   the actuating device comprises a plurality of S actuating units, each of which is configured to generate an actuating state at an interface of the actuating unit with respect to the optical element unit; and
   the optical element unit and the actuating device define an actuating transformation matrix which is representative of the transformation of the S actuating states into the R situation values.

3. The optical arrangement of claim 2, wherein at least one of the following holds:
   M is from 2 to 6;
   N is from 2 to 6;
   N is at least equal to the plurality M;
   R is from 2 to 6;
   S is from 2 to 6; and
   S is at least equal to the plurality R.

4. The optical arrangement of claim 2, wherein:
   the optical imaging device has a predefinable maximum permissible imaging error during operation;
   the imaging device is configured to use the M detection values to control the imaging device;
   a detection value error of at least one of the M detection values makes a contribution to the maximum permissible imaging error; and
   at least one of the following holds:
      the detection value error of the at least one detection value makes a contribution to the maximum permissible imaging error of at least 0.05% to 1.0% of the maximum permissible imaging error;
      a sum of the detection value errors of the M detection values makes a contribution to the maximum permissible imaging error of at least 0.5% to 10% of the maximum permissible imaging error; and
      the imaging device is configured to set the R situation values during the control of the imaging device, a situation value error of at least one of the R situation values makes a contribution to the maximum permissible imaging error, and the situation value error of the at least one situation value makes a contribution to the maximum permissible imaging error of at least 0.05% to 1.0% of the maximum permissible imaging error; and
      a sum of the situation value errors of the R situation values makes a contribution to the maximum permissible imaging error of at least 0.5% to 10% of the maximum permissible imaging error.

5. The optical arrangement of claim 2, wherein:
   at least two of the S actuating units define an actuating unit pair;
   each actuating unit of the actuating unit pair defines an actuating direction;
   the actuating directions of the two actuating units of the actuating unit pair lie at least substantially in a common actuating unit pair plane;
   the actuating unit pair is configured to set in at least two actuating pair degrees of freedom in the actuating unit pair plane in each case a pair situation value which is representative of a relative position or orientation of an actuating pair element reference, assigned to the actuating unit pair, of the optical element in relation to the primary reference in the respective actuating pair degree of freedom;
   the optical element unit and the actuating unit pair define an actuating pair transformation matrix which is representative of the transformation of the actuating states of the actuating unit pair into the pair situation values; and at least one member selected from the group consisting of the actuating unit pair and the optical element unit is configured so that the condition number of the actuating pair transformation matrix is 5 to 30.

6. The optical arrangement of claim 5, wherein at least one of the following holds:

at least one of the actuating pair degrees of freedom is a translational degree of freedom and one of the actuating pair degrees of freedom is a rotational degree of freedom;

the element reference of the optical element is arranged at least substantially in the actuating unit pair plane;

the element reference of the optical element coincides at least substantially with the actuating pair element reference of the optical element;

an actuating direction angle between the actuating directions of the actuating unit pair is less than 120°;

a plurality of actuating unit pairs is provided and the actuating direction angles between the actuating directions of the respective actuating unit pair deviate from one another by less than 10° to 40°;

a plurality of actuating unit pairs are provided and the actuating unit pair planes of two actuating unit pairs are inclined with respect to one another by less than 5° to 30°;

a plurality of actuating unit pairs are provided, and actuating unit pair planes of two actuating unit pairs are inclined with respect to the gravitational force direction by an inclination angle of less than 5° to 30°; and a plurality of actuating unit pairs are provided, and actuating unit pair planes of two actuating unit pairs are inclined with respect to the gravitational force direction by an inclination angle and the inclination angles differ from one another by less than 5° to 30°.

7. The optical arrangement of claim 2, wherein:

at least one of the S actuating units is supported by an actuating device supporting structure of the actuating device;

the actuating device supporting structure under oscillation excitation at at least one eigenfrequency has at least one eigenform which is assigned to the eigenfrequency and which has in particular at least one oscillation node; and at least one of the following holds:

the at least one actuating unit is configured so that a maximum change in a position and/or orientation of the at least one actuating unit in at least one oscillation degree of freedom at the at least one eigenfrequency generates a change in the actuating state of the actuating unit relative to a rest state of less than 5% to 10% of the actuating state of the actuating unit;

the at least one actuating unit defines an actuating direction, the at least one actuating unit at the at least one eigenfrequency has a maximum change in a position and/or orientation in at least one oscillation degree of freedom, and the at least one actuating unit is configured so that the actuating direction is inclined with respect to a plane perpendicular to the oscillation degree of freedom with the maximum change in the position and/or orientation by at most 5° to 30°; and the actuating device supporting structure comprises a substantially U-shaped structure for supporting at least one of the R actuating units.

8. The optical arrangement of claim 2, wherein at least one actuating unit comprises at least one actuator.

9. The optical arrangement of claim 1, wherein:

at least two of the N detection units define a detection unit pair;

each detection unit of the detection unit pair with its assigned secondary reference defines a detection direction;

the detection directions of the two detection units of the detection unit pair at least substantially lie in a common detection unit pair plane;

the detection unit pair is configured to determine in at least two detection pair degrees of freedom in the detection unit pair plane in each case a detection pair detection value which is representative of a relative position or orientation of a detection pair element reference, assigned to the detection unit pair, of the optical element in relation to the primary reference in the respective detection pair degree of freedom;

the optical element unit and the detection unit pair define a detection pair transformation matrix which is representative of the transformation of the detection signals of the detection unit pair into the detection pair detection values; and at least one member selected from the group consisting of the detection unit pair and the optical element unit is configured so that the condition number of the detection pair transformation matrix is 5 to 30.

10. The optical arrangement of claim 9, wherein at least one of the following holds:

at least one of the detection pair degrees of freedom is a translational degree of freedom and one of the detection pair degrees of freedom is a rotational degree of freedom;

the element reference of the optical element is arranged at least substantially in the detection unit pair plane;

the element reference of the optical element coincides at least substantially with the detection pair element reference of the optical element;

a detection direction angle between the detection directions of the detection unit pair is less than 120°;

a plurality of detection unit pairs is provided and the detection direction angles between the detection directions of the respective detection unit pair deviate from one another by less than 10° to 40°;

a plurality of detection unit pairs are provided and the detection unit pair planes of two detection unit pairs are inclined with respect to one another by less than 5° to 30°;

a plurality of detection unit pairs are provided, wherein the detection unit pair planes of two detection unit pairs are inclined with respect to the gravitational force direction by an inclination angle of less than 5° to 30°;

a plurality of detection unit pairs are provided, wherein the detection unit pair planes of two detection unit pairs are inclined with respect to the gravitational force direction by an inclination angle and the inclination angles differ from one another by less than 5° to 30°.

11. The optical arrangement of claim 1, wherein:

at least one of the N detection units is supported by a detection device supporting structure of the detection device;

the detection device supporting structure under oscillation excitation at at least one eigenfrequency has at least one eigenform which is assigned to the eigenfrequency and which has in particular at least one oscillation node; and at least one of the following holds:
the at least one detection unit is configured so that a maximum change in a position and/or orientation of the at least one detection unit in at least one oscillation degree of freedom at the at least one eigenfrequency generates a change in the detection value of the detection unit relative to a rest state of less than 5% to 10%;
the at least one detection unit with the assigned secondary reference defines a detection direction, the at least one detection unit at the at least one eigenfrequency has a maximum change in a position and/or orientation in at least one oscillation degree of freedom, and the at least one detection unit is configured so that the detection direction is inclined with respect to a plane perpendicular to the oscillation degree of freedom with the maximum change in the position and/or orientation by at most 5° to 30°; and
the detection device supporting structure comprises a substantially U-shaped structure for supporting at least one of the N detection units.

12. The optical arrangement of claim 1, wherein:
one of the following holds:
the element reference of the optical element is an area centroid of an optical surface of the optical element;
the element reference of the optical element is a mass centroid of the optical element;
the element reference of the optical element is a volume centroid of the optical element; and
the optical element is provided for use in an imaging device and the element reference of the optical element is a point of incidence of a central ray of a used light beam of the imaging device; and
at least one of the following holds:
the optical element comprises a reflective optical element; and
the optical element is configured for use with UV light.

13. The optical arrangement of claim 1, wherein at least one of the following holds:
at least one detection unit comprises an interferometer; and
at least one detection unit comprises an encoder.

14. An optical imaging device, comprising:
an illumination device comprising a first optical element group; and
a projection device comprising a second optical element group;
wherein:
the illumination device is configured to illuminate an object;
the projection device is configured to project an image of the object onto an image device; and
at least one member selected from the group consisting of the illumination device and the projection device comprises an optical arrangement according to claim 1.

15. A method for supporting an optical element unit comprising an optical element in an optical imaging device, the method comprising:
using a detection device comprising a plurality of N detection units in a plurality of M degrees of freedom to determine in each case a detection value which is representative of a relative position or orientation of an element reference of the optical element in relation to a primary reference of the detection device in the respective degree of freedom,
wherein at least one of the following holds:
each detection unit outputs a detection signal which is representative of a distance and/or a displacement of the detection unit in relation to a secondary reference assigned to the optical element and the respective detection unit, and the optical element unit and the detection device define a detection transformation matrix which is representative of the transformation of the N detection signals into the M detection values; and
an actuating device comprising a plurality of S actuating units in a plurality of R degrees of freedom sets in each case a situation value which is representative of a relative position or orientation of an element reference of the optical element in relation to a primary reference of the actuating device in the respective degree of freedom, and each actuating unit generates an actuating state at an interface of the actuating unit with respect to the optical element unit;
wherein the optical element unit and the actuating device define an actuating transformation matrix which is representative of the transformation of the S actuating states into the R situation values, and the condition number of a transformation matrix is defined by the ratio of the largest singular value of the transformation matrix to the smallest singular value of the transformation matrix; and
wherein at least one of the following holds:
the condition number of the detection transformation matrix is 5 to 30; and
the condition number of the actuating transformation matrix is 5 to 30.

16. The method of claim 15, wherein:
the optical imaging device has a predefinable maximum permissible imaging error during operation; and
at least one of the following holds:
the imaging device uses the M detection values for controlling the imaging device and a detection value error of at least one of the M detection values makes a contribution to the maximum permissible imaging error, and the detection value error of the at least one detection value makes a contribution to the maximum permissible imaging error of at least 0.05% to 1.0% of the maximum permissible imaging error;
a sum of the detection value errors of the M detection values makes a contribution to the maximum permissible imaging error of at least 0.5% to 10% of the maximum permissible imaging error;
the imaging device sets the R situation values during the control of the imaging device, and a situation value error of at least one of the R situation values makes a contribution to the maximum permissible imaging error, and the situation value error of the at least one situation value makes a contribution to the maximum permissible imaging error of at least 0.05% to 1.0% of the maximum permissible imaging error; and
a sum of the situation value errors of the R situation values makes a contribution to the maximum permissible imaging error of at least 0.5% to 10% of the maximum permissible imaging error, preferably at least 1% to 8% of the maximum permissible imaging error.

17. The method of claim 15, wherein:
at least two of the N detection units define a detection unit pair;
each detection unit of the detection unit pair with its assigned secondary reference defines a detection direction;
detection directions of the two detection units of the detection unit pair at least substantially lie in a common detection unit pair plane;
the detection unit pair determines in at least two detection pair degrees of freedom in the detection unit pair plane in each case a detection pair detection value which is representative of a relative position or orientation of a detection pair element reference, assigned to the detection unit pair, of the optical element in relation to the primary reference in the respective detection pair degree of freedom;
the optical element unit and the detection unit pair define a detection pair transformation matrix which is representative of the transformation of the detection signals of the detection unit pair into the detection pair detection values; and
the condition number of the detection pair transformation matrix is 5 to 30.

18. The method of claim 15, wherein:
at least two of the S actuating units define an actuating unit pair;
each actuating unit of the actuating unit pair defines an actuating direction;
the actuating directions of the two actuating units of the actuating unit pair lie at least substantially in a common actuating unit pair plane;
the actuating unit pair sets in at least two actuating pair degrees of freedom in the actuating unit pair plane in each case a pair situation value which is representative of a relative position or orientation of an actuating pair element reference, assigned to the actuating unit pair, of the optical element in relation to the primary reference in the respective actuating pair degree of freedom;
the optical element unit and the actuating unit pair define an actuating pair transformation matrix which is representative of the transformation of the actuating states of the actuating unit pair into the pair situation values; and
the condition number of the actuating pair transformation matrix is 5 to 30.

19. The method of claim 15, wherein:
the optical element unit is in at least one member selected from the group consisting of an illumination device comprising a first optical element group and a projection device comprising a second optical element group; and
the method further comprises illuminating an object via the illumination device, and imaging the object onto an image device via the projection device comprising the second optical element group.

20. An optical arrangement, comprising:
an optical element unit comprising an optical element; and
an actuating device,
wherein:
the actuating device is configured to set in a plurality of R degrees of freedom in each case a situation value which is representative of a relative position or orientation of an element reference of the optical element in relation to a primary reference of the actuating device in the respective degree of freedom;
the actuating device comprises a plurality of S actuating units, each of which is configured to generate an actuating state at an interface of the actuating unit with respect to the optical element unit;
the optical element unit and the actuating device define an actuating transformation matrix which is representative of the transformation of the S actuating states into the R situation values;
a condition number of a transformation matrix is defined by the ratio of the largest singular value of the transformation matrix to the smallest singular value of the transformation matrix;
and the actuating device and/or the optical element unit is configured in such a way that the condition number of the actuating transformation matrix is 5 to 30.

21. An optical imaging device, comprising:
an illumination device comprising a first optical element group; and
a projection device comprising a second optical element group;
wherein:
the illumination device is configured to illuminate an object;
the projection device is configured to project an image of the object onto an image device; and
at least one member selected from the group consisting of the illumination device and the projection device comprises an optical arrangement according to claim 20.

* * * * *

UNITED STATES PATENT AND TRADEMARK OFFICE
CERTIFICATE OF CORRECTION

PATENT NO. : 11,314,177 B2
APPLICATION NO. : 17/181548
DATED : April 26, 2022
INVENTOR(S) : Kugler et al.

It is certified that error appears in the above-identified patent and that said Letters Patent is hereby corrected as shown below:

On the Title Page

Item (73), delete "GmbH" insert -- GmbH, Oberkochen, Germany --.

In the Specification

Column 4, Line 28, delete "$\sqrt{\overline{EV_i(TM\,TM^T)}}$," insert --$\sqrt{\overline{EV_i(TM\,TM^T)}}$--.

Column 17, Line 48, delete "$\overrightarrow{EW_i} = (ETM)\overrightarrow{ES_j}$," insert --$\overrightarrow{EW_i} = (ETM)\overrightarrow{ES_j}$--.

Column 18, Line 39, delete "$\overrightarrow{LW_p} = (STM)\overrightarrow{AS_q}$," insert --$\overrightarrow{LW_p} = (STM)\overrightarrow{AS_q}$--.

Column 20, Line 39, delete "$IE_1$" insert -- $IE_{max}$ --.

Column 20, Line 53, delete "FEW" insert -- $FEW_i$ --.

Column 20, Line 54, delete "EW1" insert -- $EW_i$ --.

Column 22, Line 11, delete "$\overrightarrow{EPEW_i} = (EPETM)\overrightarrow{EPES_j}$," insert --$\overrightarrow{EPEW_i} = (EPETM)\overrightarrow{EPES_j}$--.

Column 24, Line 13, delete "$SPLW_p$" insert --$\overrightarrow{SPLW_p}$--.

Column 24, Line 14, delete "$SPAS_q$" insert --$\overrightarrow{SPAS_q}$--.

Signed and Sealed this
Fourth Day of October, 2022

Katherine Kelly Vidal
*Director of the United States Patent and Trademark Office*

CERTIFICATE OF CORRECTION (continued)
U.S. Pat. No. 11,314,177 B2

Column 24, Line 16, delete "$(SPSTM)\overrightarrow{SPAS_q'}$," insert -- $(SPSTM)\overrightarrow{SPAS_{q'}}$ --.

Column 24, Line 64, delete "$SDIRW_i$" insert -- $SDIRW_1$ --.